United States Patent
Obradovic et al.

(10) Patent No.: US 9,461,114 B2
(45) Date of Patent: Oct. 4, 2016

(54) SEMICONDUCTOR DEVICES WITH STRUCTURES FOR SUPPRESSION OF PARASITIC BIPOLAR EFFECT IN STACKED NANOSHEET FETS AND METHODS OF FABRICATING THE SAME

(71) Applicants: Borna J. Obradovic, Leander, TX (US); Ryan Hatcher, Austin, TX (US); Robert C. Bowen, Austin, TX (US); Mark S. Rodder, Dallas, TX (US)

(72) Inventors: Borna J. Obradovic, Leander, TX (US); Ryan Hatcher, Austin, TX (US); Robert C. Bowen, Austin, TX (US); Mark S. Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/952,152

(22) Filed: Nov. 25, 2015

(65) Prior Publication Data
US 2016/0163796 A1   Jun. 9, 2016

Related U.S. Application Data

(60) Provisional application No. 62/088,519, filed on Dec. 5, 2014.

(51) Int. Cl.
| | |
|---|---|
| *H01L 29/06* | (2006.01) |
| *H01L 29/78* | (2006.01) |
| *B82Y 10/00* | (2011.01) |
| *B82B 3/00* | (2006.01) |
| *H01L 29/16* | (2006.01) |

(52) U.S. Cl.
CPC ......... *H01L 29/0676* (2013.01); *B82Y 10/00* (2013.01); *H01L 29/0642* (2013.01); *H01L 29/16* (2013.01); *H01L 29/785* (2013.01); *B82B 3/0014* (2013.01)

(58) Field of Classification Search
None
See application file for complete search history.

(56) References Cited

U.S. PATENT DOCUMENTS

| | | | |
|---|---|---|---|
| 7,812,342 B2 | 10/2010 | Lee et al. | |
| 8,183,104 B2 | 5/2012 | Hobbs et al. | |
| 8,422,273 B2 | 4/2013 | Chang et al. | |
| 8,513,125 B2 | 8/2013 | Saracco et al. | |
| 8,665,013 B2 | 3/2014 | Saunders | |
| 8,778,768 B1 * | 7/2014 | Chang ............... | H01L 29/42392 257/213 |
| 2006/0284218 A1 | 12/2006 | Kaner et al. | |
| 2008/0093589 A1 | 4/2008 | Liu et al. | |
| 2011/0053361 A1 | 3/2011 | Muralidhar et al. | |
| 2011/0149670 A1 | 6/2011 | Heo et al. | |
| 2012/0199814 A1 | 8/2012 | Berger | |
| 2013/0273315 A1 | 10/2013 | Mansky et al. | |
| 2014/0051213 A1 | 2/2014 | Chang et al. | |

(Continued)

FOREIGN PATENT DOCUMENTS

| | | |
|---|---|---|
| CN | 102856277 A | 1/2013 |
| CN | 103117266 A | 5/2013 |
| CN | 102646626 A | 7/2014 |

*Primary Examiner* — Joseph Schoenholtz
(74) *Attorney, Agent, or Firm* — Myers Bigel & Sibley, P.A.

(57) ABSTRACT

A device may include a nanosheet field effect transistor (FET) that may include a substrate, a well that is doped with impurities at a surface of the substrate, a channel including a plurality of stacked nanosheets, a gate, a conductive material, and an isolation layer. Ones of the plurality of stacked nanosheets may include a semiconductor material that may be doped with impurities of the same conductivity type as the impurities of the well. The conductive material may be adjacent the plurality of nanosheets and may electrically connect ones of the plurality of nanosheets to the well. The isolation layer may electrically insulate the well from the workfunction metal.

20 Claims, 23 Drawing Sheets

(56) References Cited

U.S. PATENT DOCUMENTS

2014/0080253 A1 3/2014 Yamazaki
2014/0264682 A1 9/2014 Chuang et al.
2015/0001723 A1 1/2015 Chien et al.

* cited by examiner

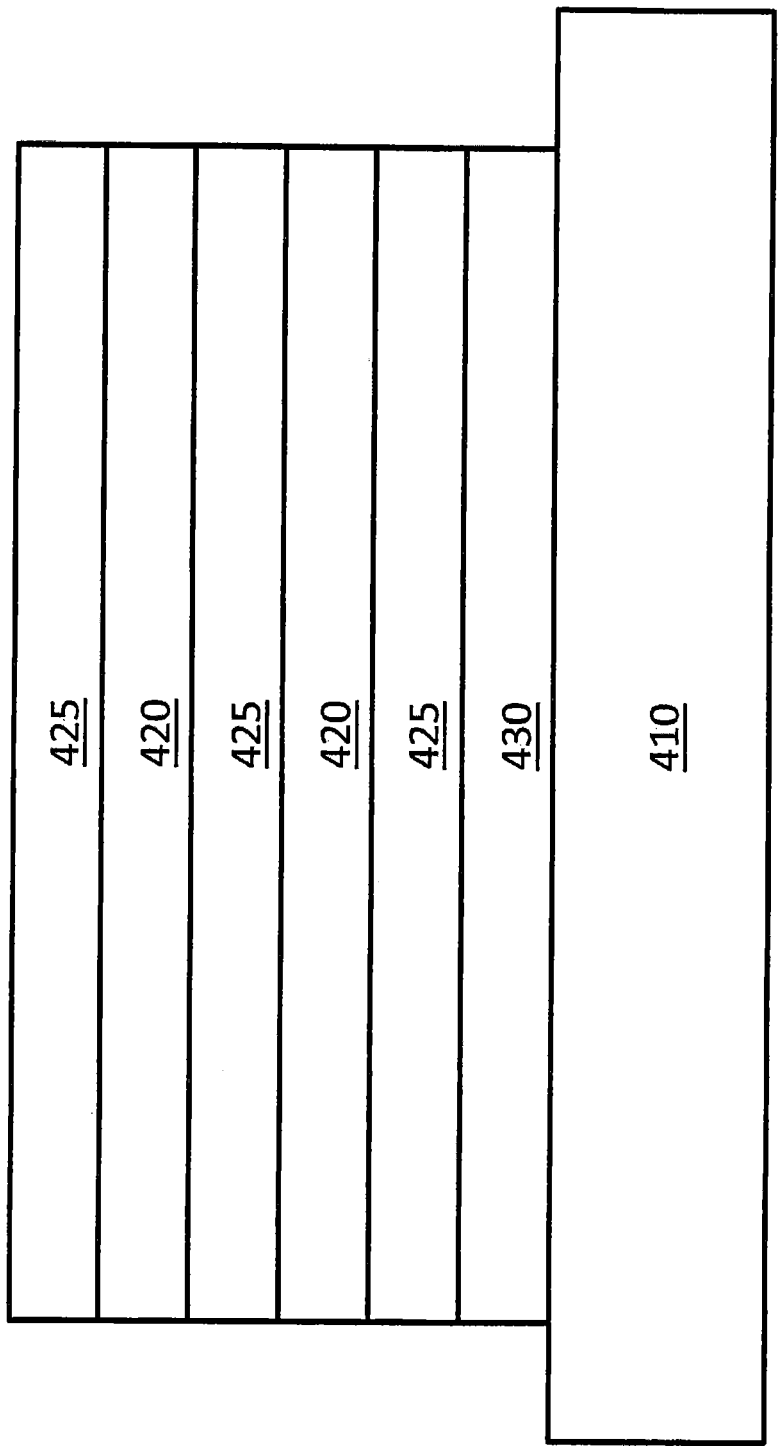

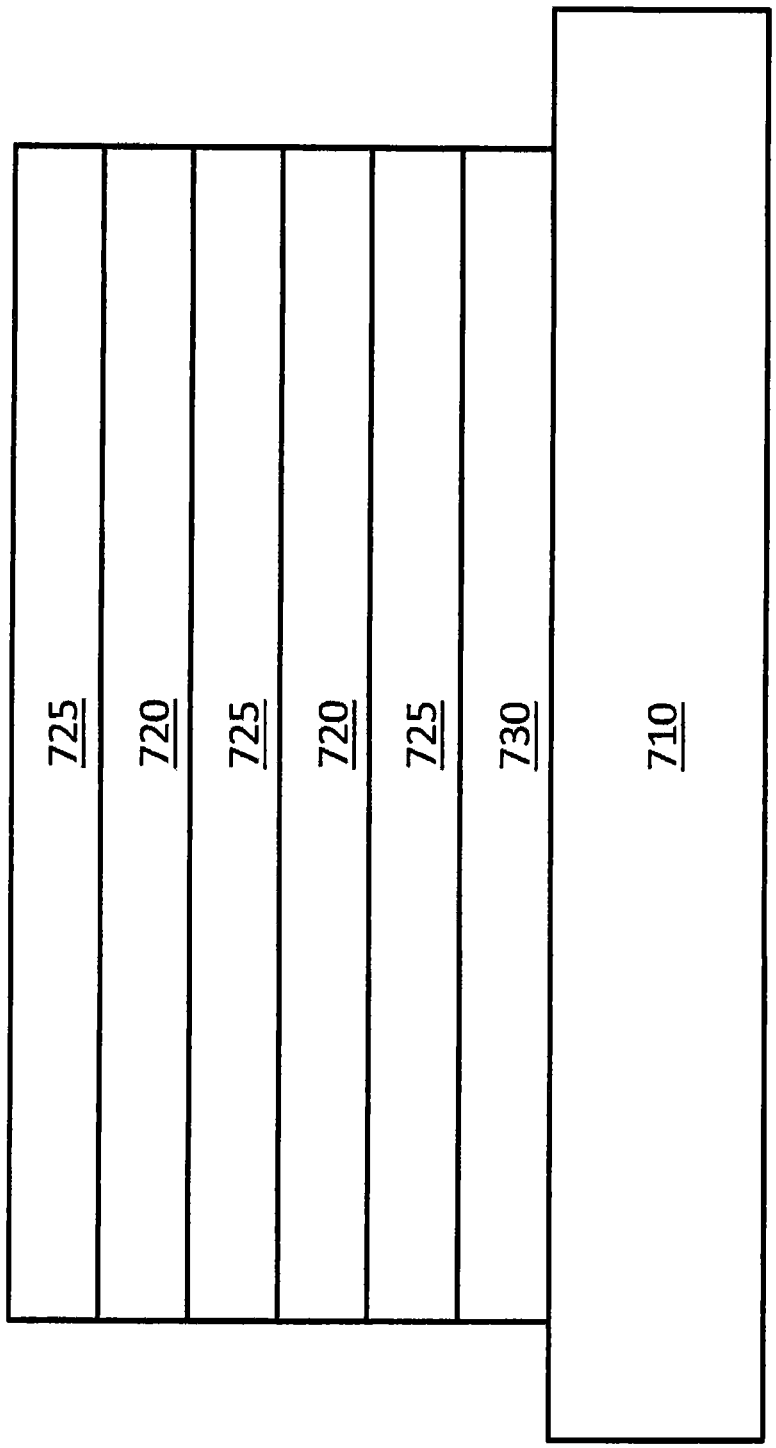

SEMICONDUCTOR DEVICES WITH STRUCTURES FOR SUPPRESSION OF PARASITIC BIPOLAR EFFECT IN STACKED NANOSHEET FETS AND METHODS OF FABRICATING THE SAME

CROSS-REFERENCE TO RELATED APPLICATION

This application claims priority under 35 U.S.C. §120 to U.S. Provisional Application Ser. No. 62/088,519, entitled A STRUCTURE FOR SUPPRESSION OF THE PARASITIC BIPOLAR EFFECT IN STACKED NANOSHEET FETS, filed in the USPTO on Dec. 5, 2014, the disclosure of which is incorporated herein by reference in its entirety.

FIELD

Some embodiments of the inventive concept relate generally to integrated circuits and, more particularly, to integrated circuits with stacked nanosheet field effect transistors (FETs) and methods of forming the same.

BACKGROUND

As the size of integrated circuits decreases, it has become desirable to increase the density of the arrangement of FET devices on a substrate. Vertical fin-based field-effect transistor (finFET) devices have been developed that include multiple vertical fins serving as conducting channel regions to enable larger effective conduction width in a small layout area overlying a substrate. However, as circuits are scaled to smaller dimensions and thus a smaller area, the lateral spacing between adjacent vertical fins may become too small to enable the vertical finFET devices to operate properly. Stacked nanosheet FETs have been developed to further enable larger effective conduction width in a small layout area overlying a substrate. A stacked nanosheet FET may include multiple nanosheets arranged in a three dimensional array on a substrate with a gate stack formed on a channel region of ones of the nanosheets. The gate stack may surround four sides of the channel region of a nanosheet (gate-all-around).

SUMMARY

According to some embodiments of the inventive concept, devices are provided. A device may include a nanosheet field effect transistor (FET). The nanosheet FET may include a substrate. The substrate may include a well at a surface of the substrate. The well may be doped with impurities. The nanosheet FET may include a channel, a gate, a conductive material, and an isolation layer. The channel may include a plurality of stacked nanosheets on the well. Ones of the plurality of stacked nanosheets may include a semiconductor material that may be doped with impurities of a same conductivity type as the impurities of the well. Ones of the plurality of stacked nanosheets may be spaced apart from each other in a direction that is perpendicular to the surface of the substrate. The gate may include a workfunction metal on the plurality of nanosheets, between adjacent ones of the plurality of nanosheets, and between the plurality of nanosheets and the well. The conductive material may be adjacent the plurality of nanosheets and may electrically connect ones of the plurality of nanosheets to the well. The isolation layer may be on the well and may electrically insulate the well from the workfunction metal.

The conductive material may include a semiconductor material that may be doped with impurities of the same conductivity type as the impurities of the well.

The conductive material may include the same semiconductor material as the plurality of nanosheets.

An impurity concentration of the conductive material may be greater than an impurity concentration of ones of the plurality of nanosheets. An impurity concentration of the well may be greater than the impurity concentration of the ones of the plurality of nanosheets.

The impurities of the well, the impurities of the nanosheets, and the impurities of the conductive material may be p-type impurities. Ones of the plurality of nanosheets may include a group IV semiconductor material that may include germanium at a first mole fraction. The conductive material may include a group IV semiconductor material that may include germanium at a second mole fraction that may be greater than the first mole fraction.

The impurities of the well, the impurities of the nanosheets, and the impurities of the conductive material may be n-type impurities. Ones of the plurality of nanosheets may include a group III-V semiconductor material that may include indium at a first mole fraction. The conductive material may include a group III-V semiconductor material that may include indium at a second mole fraction that may be less than the first mole fraction.

The isolation layer may include a wide bandgap semiconductor material.

The nanosheet FET may include a leakage current of less than about 1 nA/μm.

Ones of the plurality of nanosheets may include a thickness in the direction that is perpendicular to the surface of the substrate and a width in a direction that is parallel to the surface of the substrate. The width may be at least twice the thickness.

The nanosheet FET further may include a plurality of internal spacers. The plurality of internal spacers may be on respective ones of the plurality of nanosheets and may electrically insulate the conductive material from the workfunction metal.

According to other embodiments of the inventive concept, devices are provided. A device may include a nanosheet field effect transistor (FET). The nanosheet FET may include a substrate, a first channel stack, a second channel stack, a gate a plurality of internal spacers, a conductive material, and an isolation layer. The substrate may include a well at a surface of the substrate. The well may be doped with impurities. The first channel stack may include a first plurality of nanosheets on the well. Ones of the first plurality of stacked nanosheets may include a semiconductor material that may be doped with impurities of a same conductivity type as the impurities of the well. Ones of the first plurality of stacked nanosheets may be spaced apart from each other in a first direction that is perpendicular to the surface of the substrate.

The second channel stack may include a second plurality of nanosheets on the well. Ones of the second plurality of stacked nanosheets may include a semiconductor material that may be doped with impurities of the same conductivity type as the impurities of the well. Ones of the second plurality of stacked nanosheets may be spaced apart from each other in the first direction that is perpendicular to the surface of the substrate and spaced apart from respective ones of the first plurality of nanosheets in a second direction that is parallel to the surface of the substrate.

The gate may include a workfunction metal on the first plurality of nanosheets, between adjacent ones of the first plurality of nanosheets, between the first plurality of nanosheets and the well, on the second plurality of nanosheets, between adjacent ones of the second plurality of nanosheets, and between the second plurality of nanosheets and the well. The plurality of internal spacers may be on respective ones of the first and second pluralities of nanosheets and may electrically insulate the conductive material from the workfunction metal. The conductive material may be between the first and second pluralities of nanosheets and may electrically connect ones of the first and second pluralities of nanosheets to the well. The isolation layer may be on the well and may electrically insulate the well from the workfunction metal.

The conductive material may include a semiconductor material that may be doped with impurities of the same conductivity type as the impurities of the well.

The conductive material may include the same semiconductor material as the plurality of nanosheets.

An impurity concentration of the conductive material may be greater than an impurity concentration of ones of the plurality of nanosheets. An impurity concentration of the well may be greater than the impurity concentration of the ones of the plurality of nanosheets.

The impurities of the well, the impurities of the nanosheets, and the impurities of the conductive material may be p-type impurities. Ones of the plurality of nanosheets may include a group IV semiconductor material that may include germanium at a first mole fraction. The conductive material may include a group IV semiconductor material that may include germanium at a second mole fraction that may be greater than the first mole fraction.

The impurities of the well, the impurities of the nanosheets, and the impurities of the conductive material may be n-type impurities. Ones of the plurality of nanosheets may include a group III-V semiconductor material that may include indium at a first mole fraction. The conductive material may include a group III-V semiconductor material that may include indium at a second mole fraction that may be less than the first mole fraction.

The isolation layer may include a wide bandgap semiconductor material.

The device may include a leakage current of less than about 1 nA/μm.

Ones of the first plurality of nanosheets and ones of the second plurality of nanosheets may include a thickness in the first direction that is perpendicular to the surface of the substrate and a width in a direction that is parallel to the surface of the substrate. The width may be at least twice the thickness.

The nanosheet FET further may include a plurality of internal spacers on respective ones of the first and second pluralities of nanosheets. The plurality of internal spacers may electrically insulate the conductive material from the workfunction metal.

The device may include a second nanosheet FET that may include a third channel stack. The third channel stack may include a third plurality of nanosheets on the well. Ones of the third plurality of nanosheets may be not electrically connected to the well. Ones of the third plurality of nanosheets may include a thickness in the first direction that is perpendicular to the surface of the substrate that may be greater than a thickness in the first direction that is perpendicular to the surface of the substrate of ones of the first and second pluralities of nanosheets.

According to other embodiments of the inventive concept, methods of forming devices that include a nanosheet FET may be provided. A method may include forming a well that may be doped with impurities at a surface of a substrate. The method may include depositing a nanosheet stack on the well. The nanosheet stack may include an isolation layer that may be adjacent the surface of the substrate and a plurality of layers of a sacrificial gate material and may be interspersed by respective nanosheet layers of a channel material. The channel material may include a semiconductor material that may be doped with impurities of a same conductivity type as the impurities of the well.

The method may include masking and etching the nanosheet stack to define first and second separated nanosheet stacks. The method may include overetching portions of the surface of the substrate not covered by the first and second separated nanosheet stacks. The method may include depositing an insulating material in the overetched portions of the surface of the substrate. The method may include removing portions of edges of the plurality of layers of the sacrificial gate material of the first and second separated nanosheet stacks. The method may include forming internal spacers in the removed portions of the edges of the plurality of layers of the sacrificial gate material of the first and second separated nanosheet stacks. The method may include forming a masking layer comprising resist or other material between the first and second nanosheet stacks. The method may include removing the plurality of layers of the sacrificial gate material of the first and second separated nanosheet stacks. The method may include depositing a workfunction metal on the first and second nanosheet stacks and in spaces formed by the removing the plurality of layers of the sacrificial gate material of the first and second separated nanosheet stacks. The method may include removing the masking layer and the insulating material in the overetched portions of the surface of the substrate under the masking layer.

The method may include depositing a conductive material in a space formed by the removing the masking layer and the insulating material. The conductive material may electrically connect ones of the nanosheet layers of channel material of the first and second nanosheet stacks to the well. The conductive material may include a semiconductor material that may be doped with impurities of the same conductivity type as the impurities of the well. The method may include forming an insulator on a top surface of the conductive material. The method may include depositing a bulk metal gate material on the first and second nanosheet stacks. The bulk metal gate material may electrically connect to the workfunction metal.

According to other embodiments of the inventive concept, methods of forming devices that include a nanosheet FET may be provided. A method may include forming a well that may be doped with impurities at a surface of a substrate. The method may include depositing a nanosheet stack on the well. The nanosheet stack may include an isolation layer that may be adjacent the surface of the substrate and a plurality of layers of a sacrificial gate material and may be interspersed by respective nanosheet layers of a channel material. The channel material may include a semiconductor material that may be doped with impurities of a same conductivity type as the impurities of the well.

The method may include forming a wrap-around spacer on the nanosheet stack. The method may include removing the plurality of layers of the sacrificial gate material. The method may include depositing a workfunction metal on the stack and in spaces formed by the removing the plurality of layers of the sacrificial gate material. The method may include masking and etching a contact hole that extends through the nanosheet stack and into a portion of the surface of the substrate. The method may include etching portions of the workfunction metal exposed by the contact hole. The method may include forming internal spacers in the etched portions of the workfunction metal.

The method may include depositing a conductive material in the contact hole. The conductive material may electrically connect ones of the nanosheet layers of channel material to the well. The conductive material may include a semiconductor material that may be doped with impurities of the same conductivity type as the impurities of the well. The method may include depositing a bulk metal gate material on nanosheet stack. The bulk metal gate material may electrically connect to the workfunction metal.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

FIGS. 5A-5G are a cross sectional views schematically illustrating stages of methods of manufacturing the nanosheet FET of FIG. 4.

FIGS. 8A-8H are a cross sectional views schematically illustrating stages of methods of manufacturing the nanosheet FET of FIG. 7.

DETAILED DESCRIPTION OF THE EMBODIMENTS

Figure 1A:
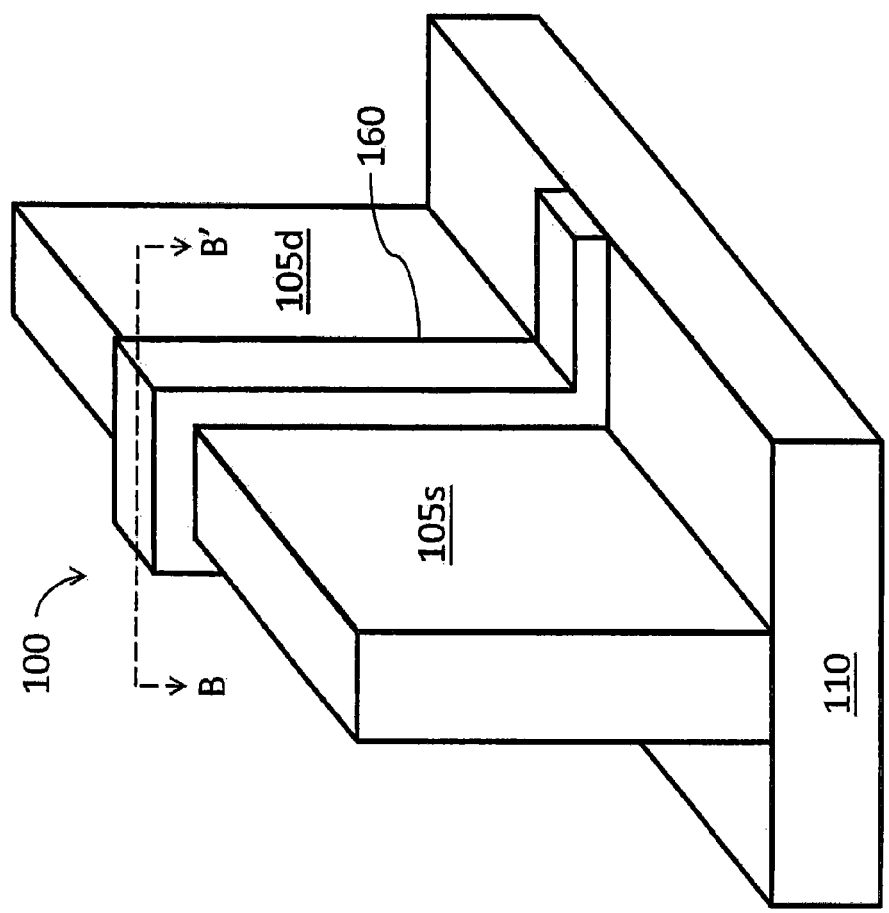
FIG. 1A is a prospective view schematically illustrating a conventional nanosheet FET.

Embodiments are described in detail with reference to the accompanying drawings. The inventive concept, however, may be embodied in various different forms, and should not be construed as being limited only to the illustrated embodiments set forth herein. Rather, these embodiments are provided as examples so that this disclosure will be thorough and complete, and will fully convey the concept of the inventive concept to those skilled in the art. Unless otherwise noted, like reference numerals denote like elements throughout the attached drawings and written description, and thus descriptions may not be repeated.

The terminology used herein is for the purpose of describing particular embodiments only and is not intended to be limiting of the inventive concept. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element such as a layer, region or substrate is referred to as being "on" another element, it can be directly on the other element or intervening elements may be present. It will be further understood that when an element such as a layer, region or surface is referred to as being "adjacent" another element, it can be directly adjacent the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Example embodiments of aspects of the present inventive concept explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices according to various embodiments described herein may be embodied in microelectronic devices, such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

As used herein, the term integrated circuit may refer to a semiconductor device and/or a circuit including one or more electrical circuits and/or components thereof.

Figure 1B:
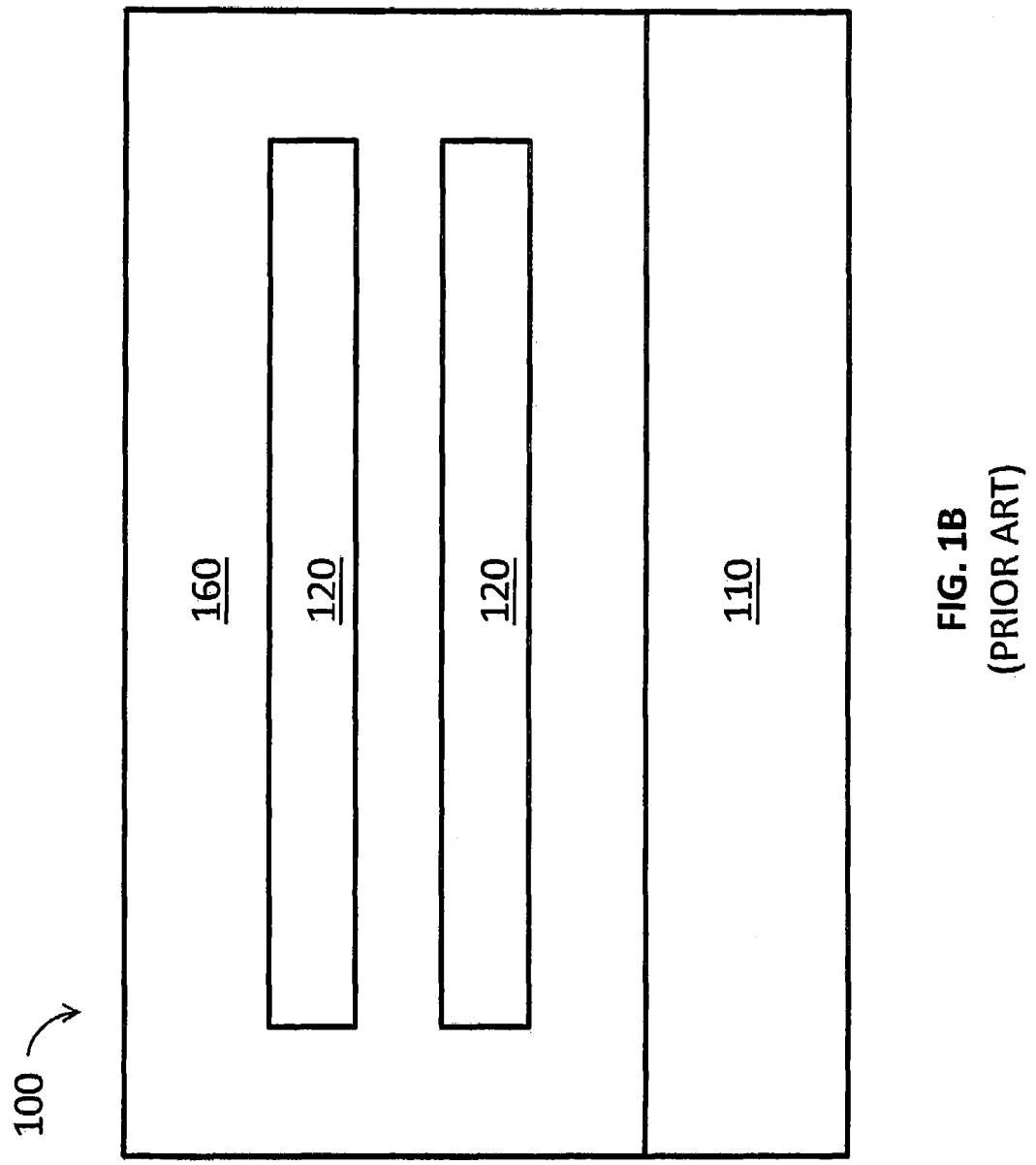
FIG. 1B is a cross-sectional view taken along the line B-B' of FIG. 1A.

Reference is now made to FIGS. 1A and 1B, which are a prospective view schematically illustrating a conventional nanosheet FET and a cross-sectional view taken along the line B-B' of FIG. 1A, respectfully. A stacked nanosheet FET 100 may be formed on a substrate 110. The substrate 110 may be an insulating substrate 110. For example, the substrate 110 may be a semiconductor on insulator (xOI) such as a silicon on insulator (SOI) structure. The stacked nanosheet FET 100 may include vertically stacked channel patterns. Qnes of the channel patterns may include one or more nanosheets 120 arranged in a horizontal plane that is parallel to a surface of the substrate 110. Although two channels patterns each including one nanosheet is illustrated, a stacked nanosheet FET may have a different number of stacked channel patterns and/or a different number of nanosheets in the horizontal plane of the channel patterns. The stacked channel patterns may perform a function of a channel of the stacked nanosheet FET 100. In other words, the nanosheets 120 may perform the function of the channel of the stacked nanosheet FET 100. Ones of the nanosheets 120 may include a thin layer of conducting channel material. For example, ones of the nanosheets 120 may include Si, SiGe, Ge, and/or a Group III-V semiconductor material, for example InGaAs.

Although two vertically stacked channel patterns are illustrated in FIG. 1B, more vertically stacked channel patterns may be provided. For example, the vertically stacked channel patterns may include three or more vertically stacked channel patterns.

The stacked nanosheet FET 100 may include a gate stack 160 surrounding portions of the vertically stacked channel patterns. The gate stack may perform a function of a gate of the stacked nanosheet FET 100. The gate stack may include a gate dielectric material surrounding portions of ones of the nanosheets 120. For example, the gate dielectric material may surround top, bottom, and/or sidewall surfaces of ones of the nanosheets 120 of the vertically stacked channel patterns. The gate dielectric material may electrically insulate the nanosheets 120 from electrically conductive portions of the gate stack.

The gate stack may include a low resistance gate metal layer surrounding portions of the vertically stacked channel patterns. The low resistance gate metal layer may extend on the gate dielectric material between adjacent ones of the vertically stacked channel patterns. The low resistance gate metal layer may surround top, and bottom surfaces of portions of ones of the vertically stacked channel patterns. The low resistance gate metal layer 160 may further surround outer edges of outer ones of the ones of the nanosheets 120. The gate dielectric material may electrically insulate the nanosheets 120 from the low resistance gate metal layer 160. The gate stack may include a work function tuning metal layer that may be between the low resistance gate metal layer 160 and the gate dielectric material and/or replacing portions of the illustrated low resistance gate metal layer. The gate dielectric material may electrically insulate the nanosheets 120 from the low resistance gate metal layer 160 and/or the work function tuning metal layer.

The stacked nanosheet FET 100 may include a source region 105s and a drain region 105d on opposing ends of the vertically stacked channel patterns. The source region 105s and the drain region 105d may be connected to respective ends of ones of the vertically stacked channel patterns. In other words, the source region 105s and the drain region 105d may be connected to respective ends of ones of the nanosheets 120. The source region 105s may perform a function of a source of the stacked nanosheet FET 100. The drain region 105d may perform a function of a drain of the stacked nanosheet FET 100.

An effective width of the stacked nanosheet FET 100 may be increased by providing more vertically stacked layers of channel patterns. Thus, the stacked nanosheet FET 100 may be advantageous relative to a bulk finFET. However, the stacked nanosheet FET 100 may have an important disadvantage, as compared to bulk FinFETs. The stacked nanosheet FET 100 may be significantly more affected by a Parasitic Bipolar Effect (PBE). PBE may be present in all devices to varying degrees. However, PBE may be most pronounced in fully-insulated structures, such as semiconductor on insulator (xOI) and nanosheet devices. PBE may be caused by the buildup of minority carriers in the channel. The minority carriers may arise due to various mechanisms including, for example, Band-To-Band Tunneling (BTBT) and pair generation in the depletion regions near the drain.

Figure 2:
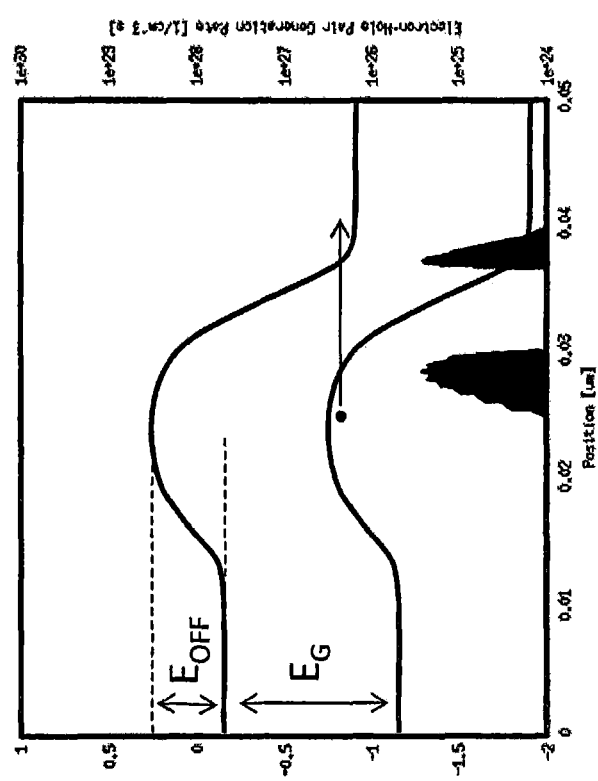
FIG. 2 is a diagram illustrating a relation between electron energy levels and position and illustrating minority carriers generated within a conventional nanosheet FET.

FIG. 2 is a diagram illustrating a relation between electron energy levels and position and illustrating minority carriers generated within a conventional nanosheet FET. Referring to FIG. 2, while a transistor is in an off state, an electron may tunnel across a band gap from a valence band at the gate to a conduction band at the drain to produce BTBT leakage current. The valence electron tunneling of electrons may produce an accumulation of minority carriers, which may typically accumulate in the channel region. The generated minority carriers may face electrostatic barriers to the source and to the drain. In bulk finFET devices, a conduction path to the substrate may exist. The conduction path to the substrate in bulk finFET devices may sweep away the generated minority carriers and the minority carriers may not accumulate in the channel of the bulk finFET devices. In xOI and nanosheet structures however, no such path may exist. The isolation of the channel may trap the generated minority carriers in the channel region.

Figure 3:
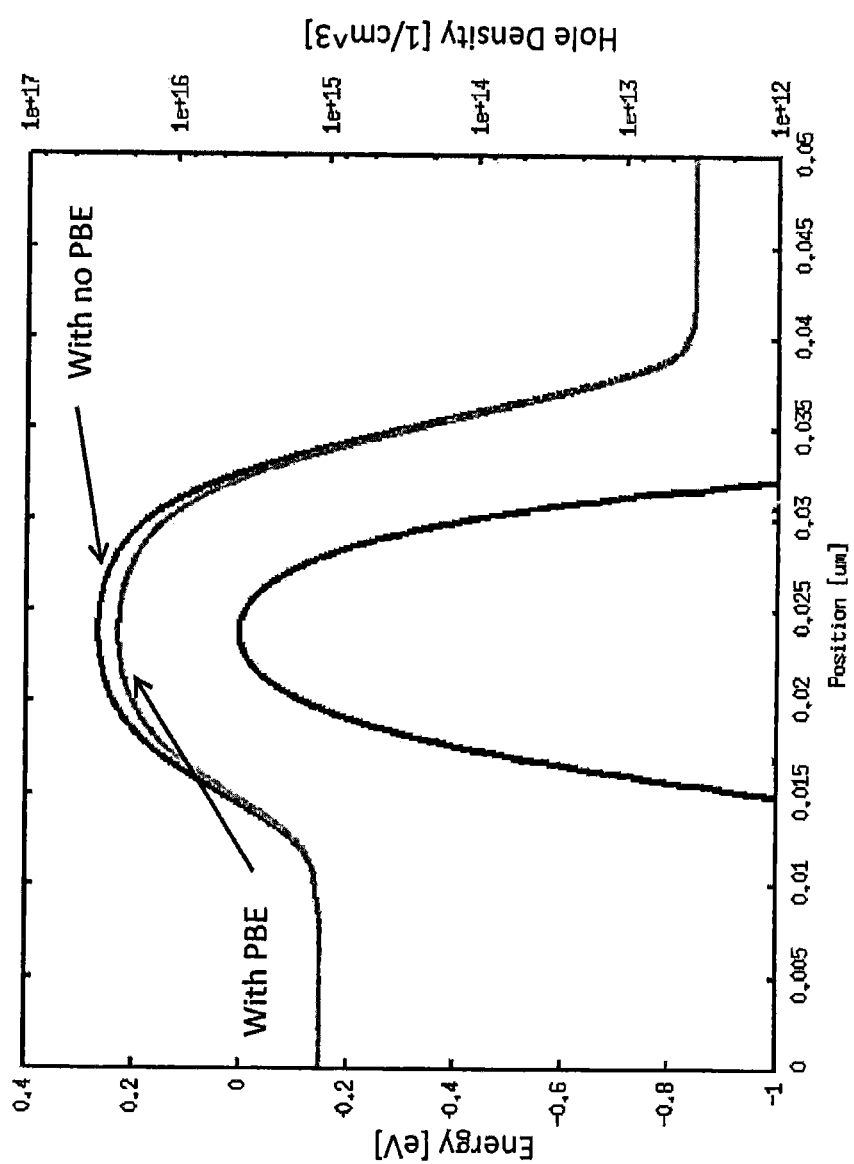
FIG. 3 is a diagram illustrating an effect of hole concentration on electron energy levels within a conventional nanosheet FET.

FIG. 3 is a diagram illustrating an effect of hole concentration on electron energy levels within a conventional nanosheet FET. Referring to FIG. 3, the buildup of minority carriers may result in a gradual buildup of charge in the channel, resulting in a lowering of the potential barrier between the source and channel. This lowering in turn may increase majority carrier injection from the source, increasing current in the off-state of the transistor (while permitting the excess minority carriers to reach steady-state concentration). The lowering of the source/channel barrier and increased majority carrier injection due to the presence of minority carriers is conceptually similar to the operation of a bipolar transistor and may also be referred to as a "Parasitic Bipolar Effect", with an associated gain β defined as the ratio of the additional injected majority current at the source to the injected minority current in the channel.

Some nanosheet structures may be particularly vulnerable to this effect. While xOI devices may have a channel/BOX interface on which rapid recombination can take place, thereby reducing β, gate-all-around (GAA) nanosheet devices may not have such an interface. The entire nanosheet channel of GAA nanosheet devices may be wrapped in a high-quality gate dielectric. Deliberately increasing the defectivity of the said interface in order to achieve a suitable recombination rate may result in mobility degradation, increased 1/f noise, and overall performance loss, as well as possible source-drain shorts with the associated yield loss.

The values of β for some nanosheet transistors may be significantly large. For SiGe devices, gains on the order of ~1000 may be expected. Direct bandgap III-V devices may have somewhat lower gains, which may be on the order of 10-100. The gain may be significantly lower for the III-V devices due to the high rate of Auger recombination. The result may be a reduced steady-state minority concentration in the channel, and consequently reduced gain. However, even a gain of 100 may be very significant for Regular-VT (RVT) devices. Because an RVT device may require a maximum leakage level of ~0.1 nA/um, an RVT device with a PBE β of 100 may need to reduce the sum of all leakage mechanisms (i.e. BTBT and others) to below 1 pA/um. This may be quite challenging, and may require performance and/or leakage tradeoffs in the device design, as well as nearly defect-free processing. It is therefore highly desirable to suppress the PBE gain as much as possible, at least for RVT devices.

Figure 4:
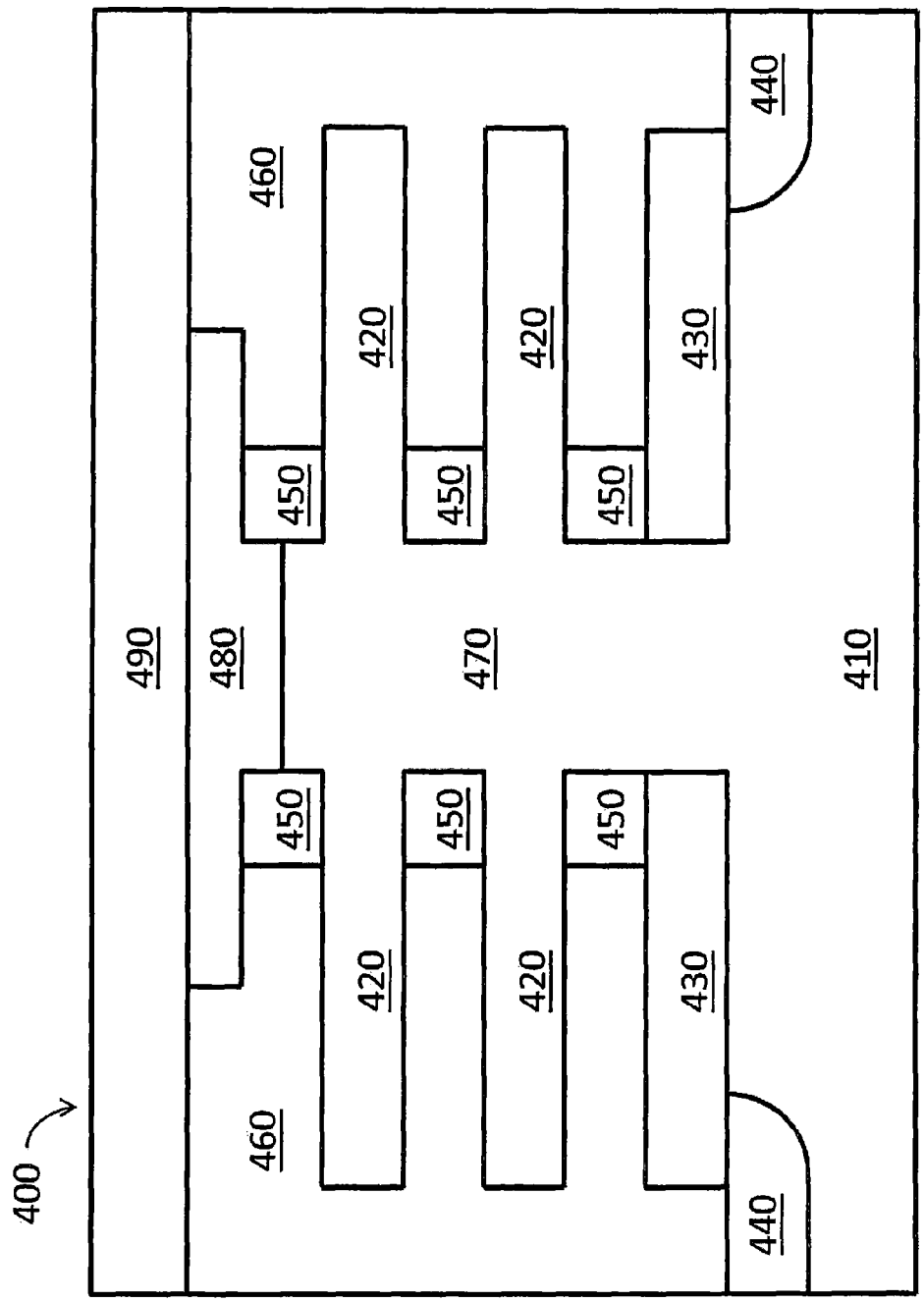
FIG. 4 is a cross sectional view schematically illustrating a nanosheet FET according to some embodiments of the inventive concept.

FIG. 4 is a cross sectional view schematically illustrating a nanosheet FET according to some embodiments of the inventive concept. Referring to FIG. 4, a stacked nanosheet FET 400 may include a substrate including a well 410 at a surface of the substrate and doped with impurities. For example, the well 410 may be a p+ well.

The nanosheet FET 400 may include a channel including stacked nanosheets 420 on the well 410. The channel may include multiple nanosheets 420. The stacked nanosheets 420 may include a semiconductor material that may be doped with impurities of the same conductivity type as the impurities of the well 410. In some embodiments, the stacked nanosheets may be intrinsic or lightly doped. For example, the nanosheets 420 may be p-channel layers. The stacked nanosheets 420 may be spaced apart from each other in a direction that is perpendicular to the surface of the substrate.

The nanosheet FET 400 may include a gate surrounding portions of the stacked nanosheets 420. The gate may include a workfunction metal 460 and a bulk metal 490. In some embodiments, the workfunction metal 460 may be on the nanosheets 420, between adjacent ones of the nanosheets 420, and/or between the nanosheets 420 and the well 410. However, in other embodiments, portions illustrated as the workfunction metal 460 may be replaced with the bulk metal 490. The bulk metal may 490 be on the workfunction metal 460.

The nanosheet FET 400 may include a conductive material 470 that may be adjacent the nanosheets 420 and may electrically connect the nanosheets 420 to the well 410. The conductive material 470 may provide a conductive path from the stacked nanosheets 420 to the substrate for minority carriers. In some embodiments, the conductive material 470 and the well 410 may each be doped at a greater impurity concentration than an impurity concentration of the nanosheets 420. For example, in some embodiments, the conductive material 470 and the well 410 may each be moderately doped and the nanosheets 420 may be intrinsic or lightly doped. Thus, majority carriers in the nanosheets 420 may face an electrostatic barrier while minority carriers may be pulled into the substrate. This may decrease and/or virtually elimination PBE gain while retaining near-GAA electrostatic control of the nanosheets 420. The stacked nanosheet FET 400 may therefore be used for RVT applications and may have leakage currents on the order of about 0.1 to 1 nA/μm.

The structure of the stacked nanosheet FET 400 may be particularly suitable for wide nanosheets 420, where a width of the nanosheets 420 is significantly greater than a thickness of the nanosheets 420. Nanosheet FETs with more narrow nanosheets, for example nanowires, may see a non-negligible penalty in the electrostatic properties if using the plug of conductive material. Therefore, this structure may be non-optimal for PBE suppression in nanowires.

The nanosheet FET 400 may be a p-type FET or an n-type FET. In a p-type nanosheet FET 400, the conductive material 470, the well 410, and/or the nanosheets 420 may be n-doped. In an n-type nanosheet FET 400, the conductive material 470, the well 410, and/or the nanosheets 420 may be p-doped.

The nanosheet FET 400 may include an isolation layer 430 on the surface of the substrate that may electrically insulate the well 410 from the workfunction metal 460. The nanosheet FET 400 may include one or more regions of insulating material 440 in the substrate that may electrically insulate the well 410 from the workfunction metal 460. The nanosheet FET 400 may include internal spacers 450 adjacent the conductive material 470 that may electrically insulate the conductive material 470 from the workfunction metal 460. The internal spacers may include a thickness sufficient to suppress a parasitic capacitance between the gate and base of the stacked nanosheet FET 400. The nanosheet FET 400 may include an insulator 480 on the conductive material 470 that may electrically insulate the conductive material 470 from the bulk metal 490.

An integrated circuit may include multiple stacked nanosheet FETs 400. For example, an integrated circuit may include n-type stacked nanosheet FETs 400 and p-type stacked nanosheet FETs 400. In some embodiments, not all of the stacked nanosheet FETs 400 of the integrated circuit may include the same materials. For example, in some embodiments, the n-type stacked nanosheet FETs 400 may include different materials than the p-type stacked nanosheet FETs 400.

In some embodiments, an integrated circuit may include stacked nanosheet FETs 400 that include conductive material 470 that connects the nanosheets 420 to the well 410 and may include stacked nanosheet FETs that do not include the conductive material. The stacked nanosheet FETs that do not include the conductive material may be gate-all-around (GAA) nanosheet devices. The nanosheets of the GAA nanosheet devices may be thicker than the nanosheets 420 of the stacked nanosheet FETs 400.

Figure 5B:
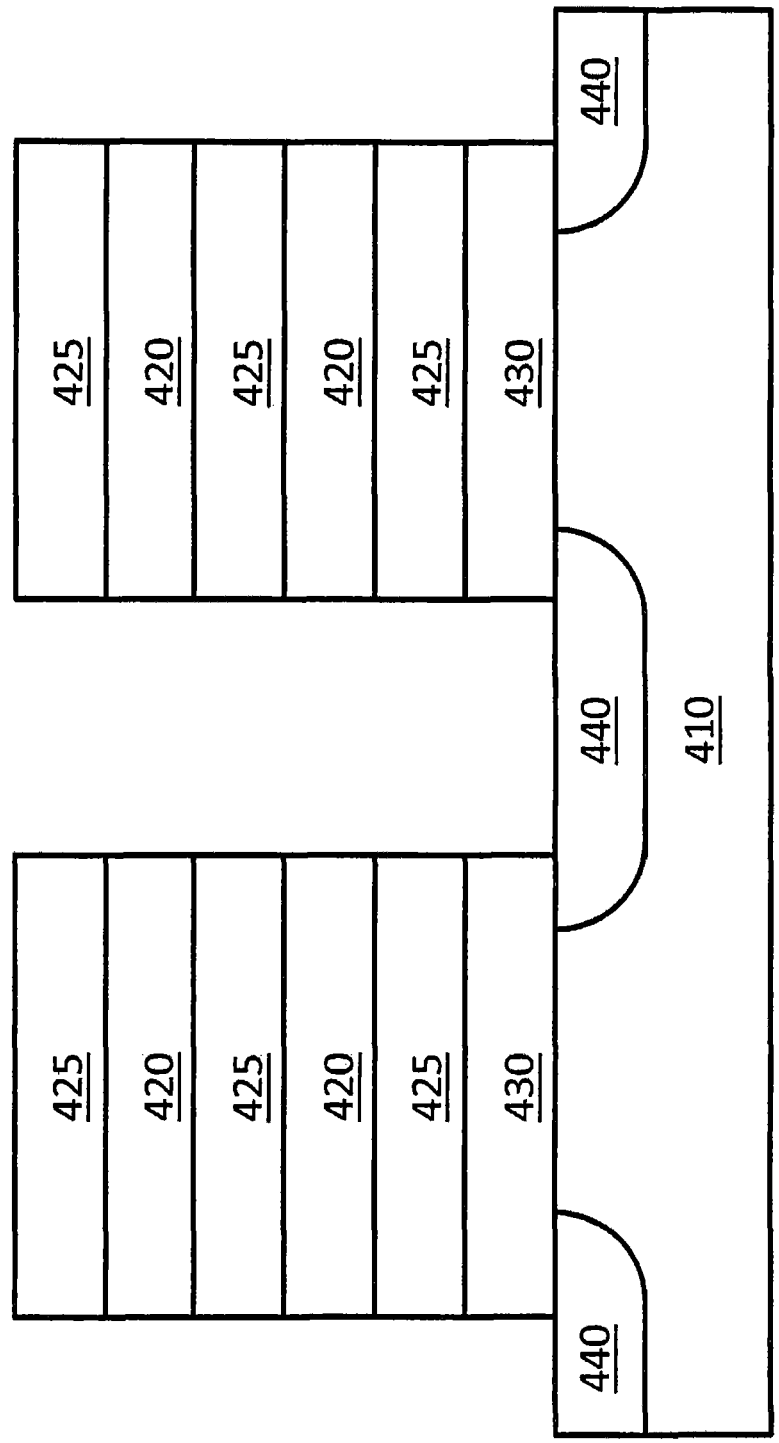

FIGS. 5A-5G are a cross sectional views schematically illustrating stages of methods of manufacturing the nanosheet FET of FIG. 4. Referring to FIG. 5A, a semiconductor stack may be grown on a well 410 that is at a surface of a substrate. The semiconductor stack may include an isolation layer 430 on the well 410 and alternating stacked layers of sacrificial gate material 425 and nanosheet layers of channel material 420 on the isolation layer 430. The well 410, the isolation layer 430, the layers of sacrificial gate material 425, and the nanosheet layers of channel material 420 may all include crystalline materials that may be approximately lattice-matched to each other and that may have a strong relative etch selectivity to each other.

The well 410 may be on a strain-relaxed buffer and/or may be cut and transferred from a donor wafer onto the substrate. The well 410 may be doped with impurities. For example, the well 410 may be a p+ well. The well may form a large region and may have multiple transistors formed on the well 410.

The nanosheet layers of channel material 420 may include a Group IV and/or a Group III-V semiconductor material. For example, the nanosheet layers of channel material 420 may include SiGe, InGaAs, and/or InGaSb. As used herein, the term "nanosheet" may include a nanostructure with a thickness that is less than about 10 nm. In some embodiments, a thickness of ones of the nanosheet layers of channel material 420 may be in a range of about 5 nm to about 8 nm, but aspects of the present inventive concept are not limited thereto. For example, some embodiments may include nanosheet layers having a thickness that is less than 5 nm or greater than 8 nm.

The layers of sacrificial gate material 425 may separate the nanosheet layers of channel material 420. In some embodiments, a thickness of ones of the layers of sacrificial gate material 425 may be in a range of about 6 nm to about 20 nm, but aspects of the present inventive concept are not limited thereto. The thickness of ones of the layers of sacrificial gate material 425 may be dependent on a gate workfunction metal process. For example, some embodiments may include layers of sacrificial gate material 425 that is less than 6 nm or greater than 20 nm.

The isolation layer 430 may include a wide-bandgap semiconductor. For example, the bandgap of a wide-bandgap semiconductor may be significantly larger than one electron volt (eV). In some embodiments, the bandgap of the wide-bandgap semiconductor may be at least 3 eV. In some embodiments, the wide-bandgap semiconductor of the isolation layer 430 may have a conduction band energy that is at least 200 meV greater than a conduction band energy of the substrate and may have a valence band energy that is at least 200 meV below a valence band energy of the substrate. The wide-bandgap semiconductor of the isolation layer 430 may have a small dielectric constant and may have suitable reliability properties. For example, the wide-bandgap semiconductor of the isolation layer 430 may be able to withstand a maximum operating voltage of the nanosheet FET 400 for an expected lifespan of the nanosheet FET 400. In some embodiments, the expected lifespan may be measured in a number of years and may be, for example, 10 years. The isolation layer 430 may be sufficiently thick to suppress leakage current and reduce capacitance between a gate and a base of the completed stacked nanosheet FET 400. For example, a thickness of the isolation later 430 may be at least about 5 nm, but aspects of the present inventive concept are not limited thereto. In some embodiments, a minimum thickness of the isolation layer 430 may be larger or smaller than 5 nm depending on a composition of the isolation layer 430 and/or certain geometric considerations. In some embodiments, the nanosheet layers of channel material 420 may include a group IV semiconductor material and the isolation layer 430 may include ZnS and/or ZnSe. In some embodiments, the nanosheet layers of channel material 420 may include a group III-V semiconductor material and the isolation layer 430 may include CdS, CdSe, and/or ZnTe. In some embodiments, a lattice constant of the isolation layer 430 may be similar to a lattice constant of the nanosheet layers of channel material 420.

Referring to FIG. 5B, the semiconductor stack may be patterned and etched into separate stacks with a gap between the separate stacks. A surface of the well 410 surrounding and between the separate stacks may be overetched. The overetched portions of the well 410 may be filled in with an insulating material to create regions of insulating material 440. A wrap-around spacer may be formed on the separated stacks.

Figure 5C:
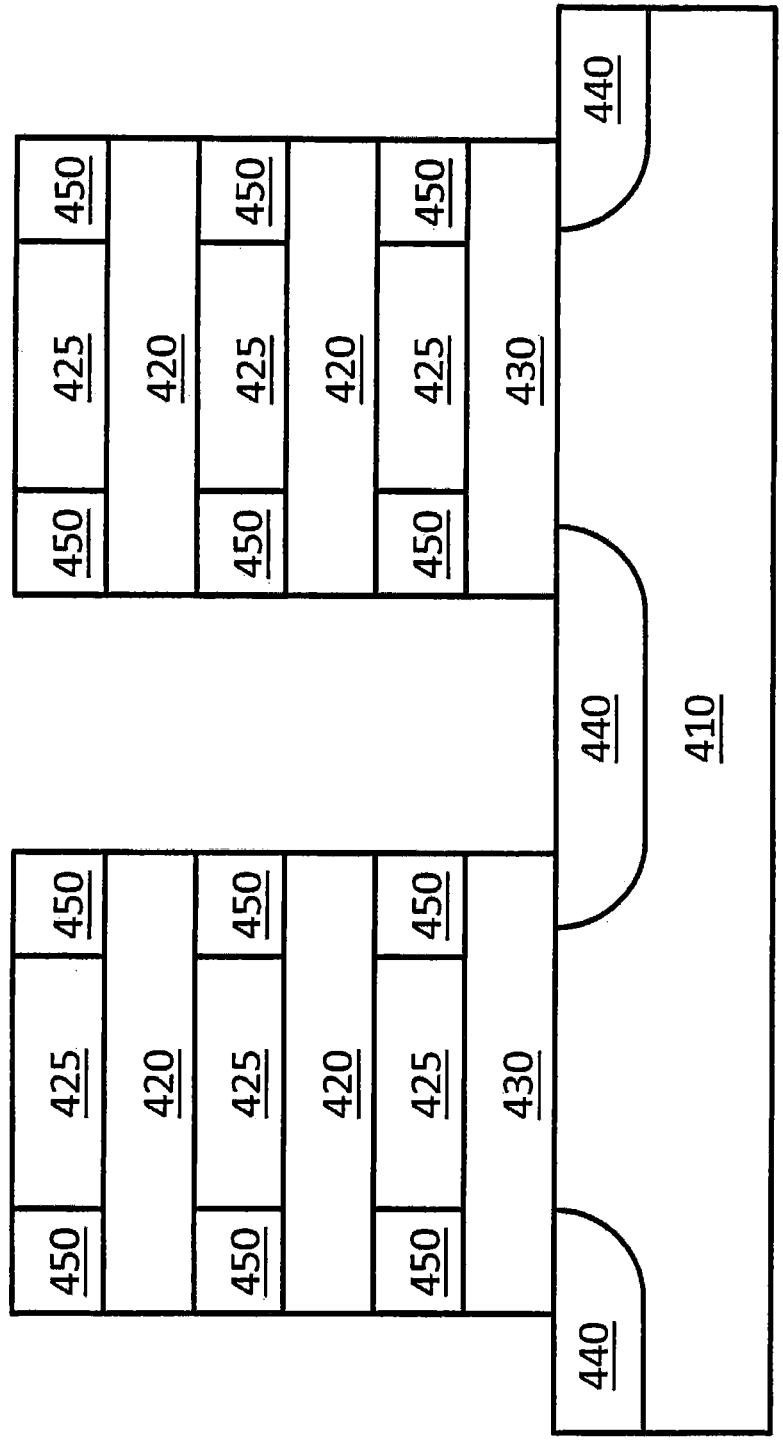

Referring to FIG. 5C, portions alongside edges of the layers of sacrificial gate material 425 may be etched and filled in with an insulating material to form internal spacers 450. Because the material of the layers of sacrificial material 425 may have a high etch selectivity to the other layers of the semiconductor stack, other layers may not be significantly etched when the layers of sacrificial gate material 425 is etched to form the internal spacers 450.

Figure 5D:
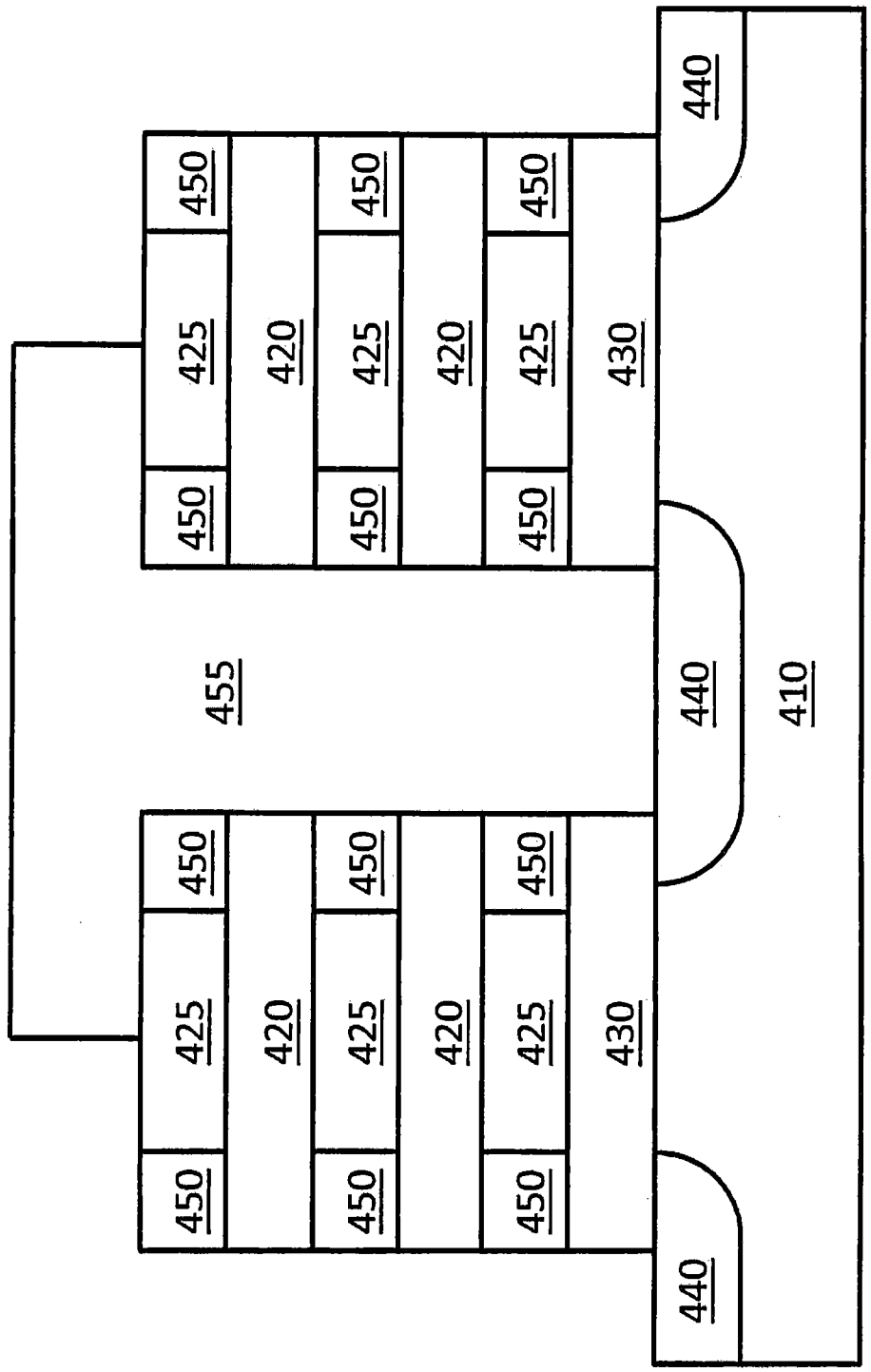

Referring to FIG. 5D, the gap between the separate stacks may be filled in with a masking layer 455 that may include a resist material and/or other materials. The masking layer 455 may also be on portions of top surfaces of the separate stacks.

Figure 5E:
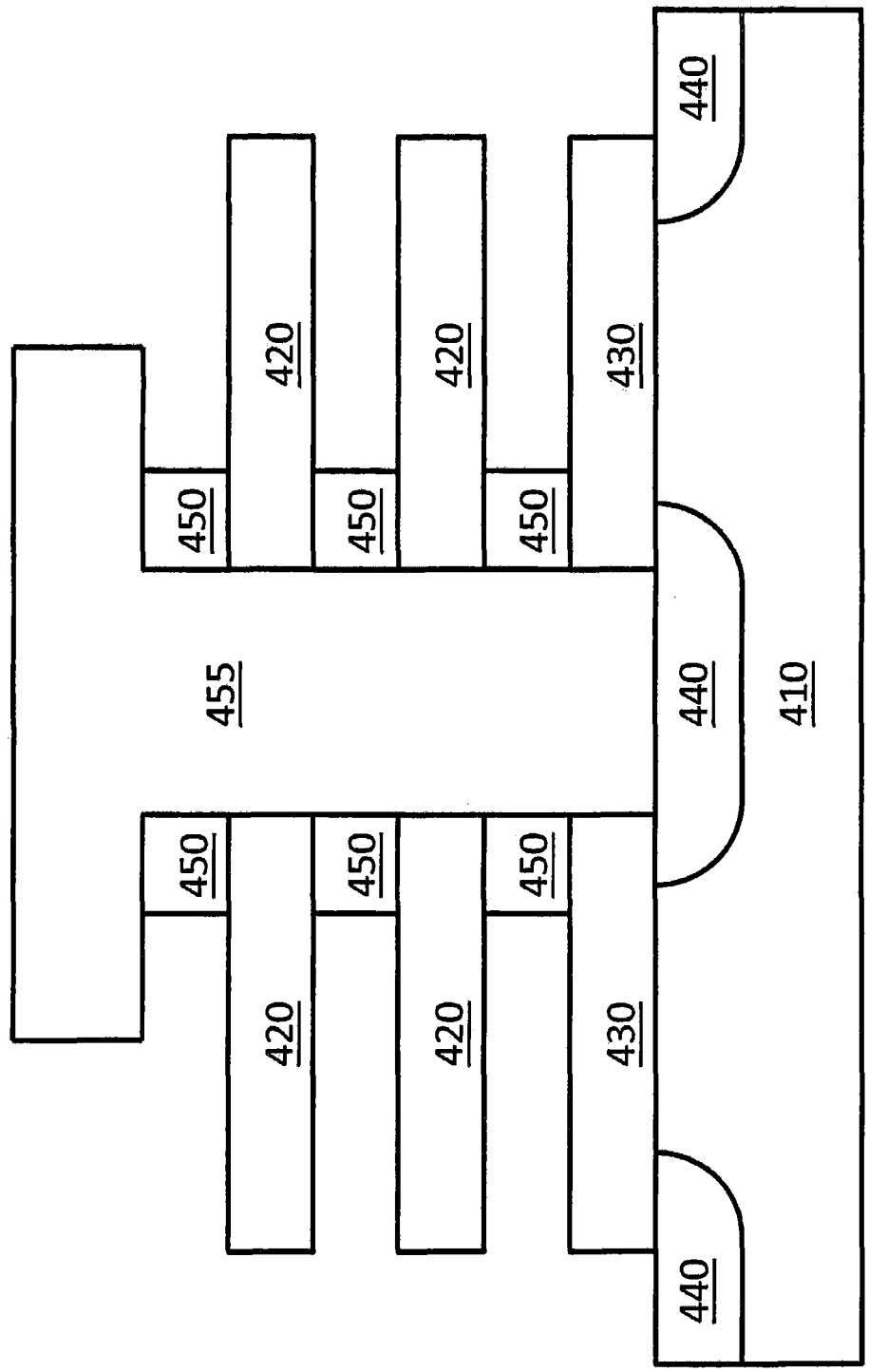

Referring to FIG. 5E, the internal spacers 450 on outer edges of the layers of sacrificial material 425, in other words, the internal spacers 450 not protected by the masking layer 455, may be removed by a selective etch process. The layers of sacrificial material 425 may also be removed by a selective etch process. The layers of sacrificial material 425 may be removed by a selective etch process that is different from the selective etch process used to remove the internal spacers 450 such that the internal spacers 450 adjacent the masking layer 455 are not removed. After the layers of sacrificial material 425 are removed, the remaining structure of the separate stacks may be held in place by the wrap-around spacer.

Figure 5F:
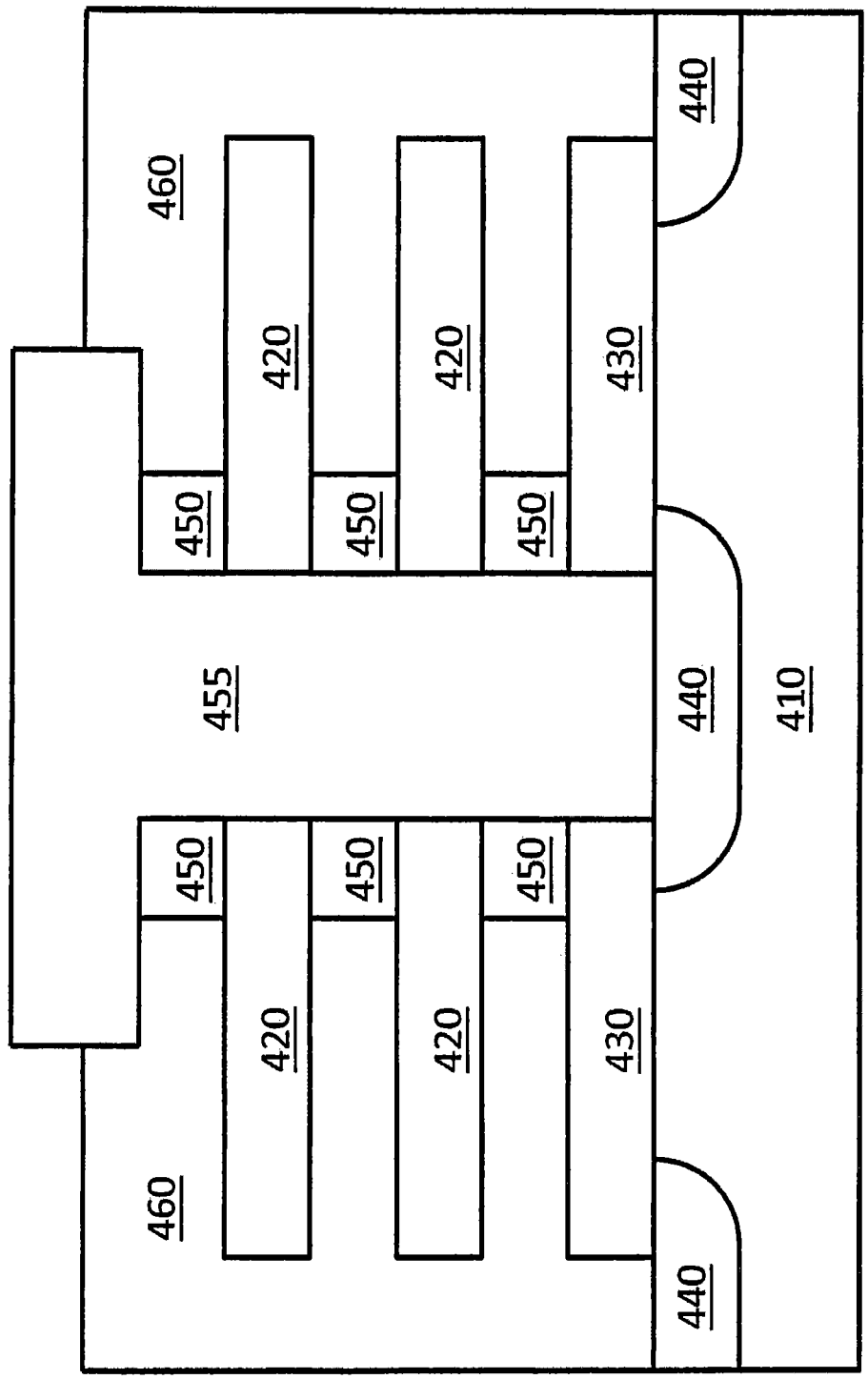

Referring to FIG. 5F, the exposed portions of the nanosheet layers of channel material 420 may be covered by a high-k dielectric material. The high-k dielectric material may electrically insulate the nanosheet layers of channel material 420 from the subsequently formed gate stack. A workfunction metal 460 may be deposited on the nanosheet layers of channel material 420, around the nanosheet layers of channel material 420, and between the nanosheet layers of channel material 420. The well 410 may be electrically insulated from the workfunction metal 460 by the isolation layers 430 and the regions of insulating material 440.

Figure 5G:
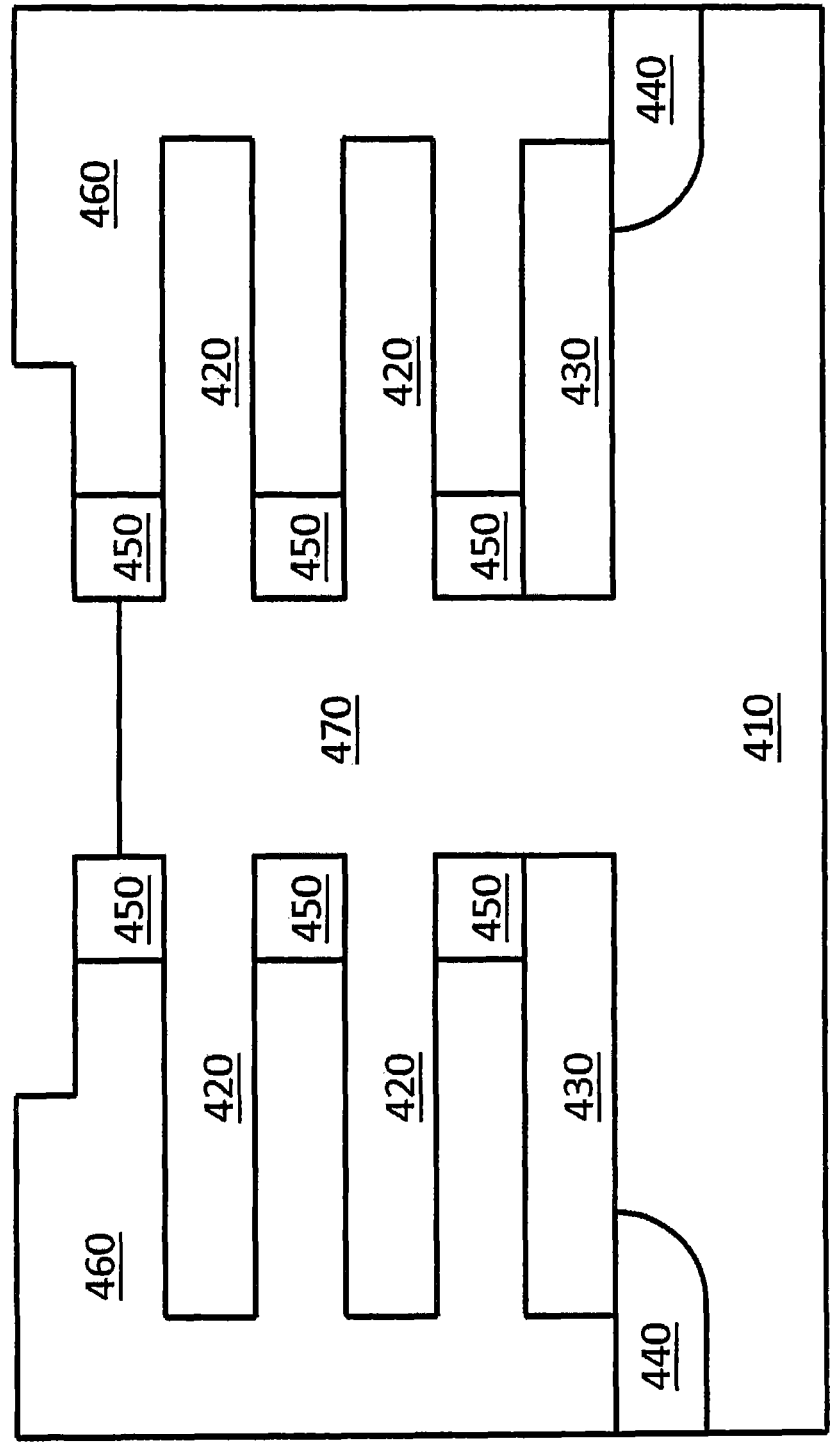

Referring to FIG. 5G, the masking layer 455 may be removed. The region of insulating material 440 that is exposed by removing the masking layer 455 may be removed in a selective etch process that does not significantly remove portions of the separate stacks. A conductive material 470 may be deposited in the gap to fill the overetched portions of the well 410 previously filled by the removed region of insulating material 440 and to fill portions of the gap. The conductive material 470 may be etched back to a level adjacent to a side wall of the internal spacer 450 furthest from the well. The conductive material may contact edge portions of the nanosheet layers of channel material 420 and may contact the well 410. The conductive material 470 may include crystalline and/or non-crystalline material, including polycrystalline material. The conductive material 470 may include any of the set of metallic and/or semiconductor materials.

In some embodiments, the nanosheet FET 400 may be a p-type FET, the nanosheet layers of channel material 420 may include SiGe with a first Ge-mole fraction, and the conductive material 470 may include SiGe with a second Ge-mole fraction that is greater than the first Ge-mole fraction. In other words, in a p-type nanosheet FET 400, the conductive material 470 may include a greater molar fraction of Ge than the nanosheet layers of channel material 420, thereby increasing the barrier between the nanosheet layers of channel material 420 and the conductive material 470 for majority carriers.

In some embodiments, the nanosheet FET 400 may be an n-type FET, the nanosheet layers of channel material 420 may include InGaAs and/or InGaSb with a first In-mole fraction, and the conductive material 470 may include InGaAs and/or InGaSb with a second In-mole fraction that is less than the first In-mole fraction. In other words, in an n-type nanosheet FET 400, the conductive material 470 may include a smaller molar fraction of In than the nanosheet layers of channel material 420, thereby increasing the barrier between the nanosheet layers of channel material 420 and the conductive material 470 for majority carriers.

Referring again to FIG. 4, an insulator 480 may be deposited on the conductive material 470 and a bulk metal gate material 490 may be deposited on the insulator 480 and on the workfunction metal 460. Thus, the stacked nanosheet FET 400 may be formed.

Figure 6:
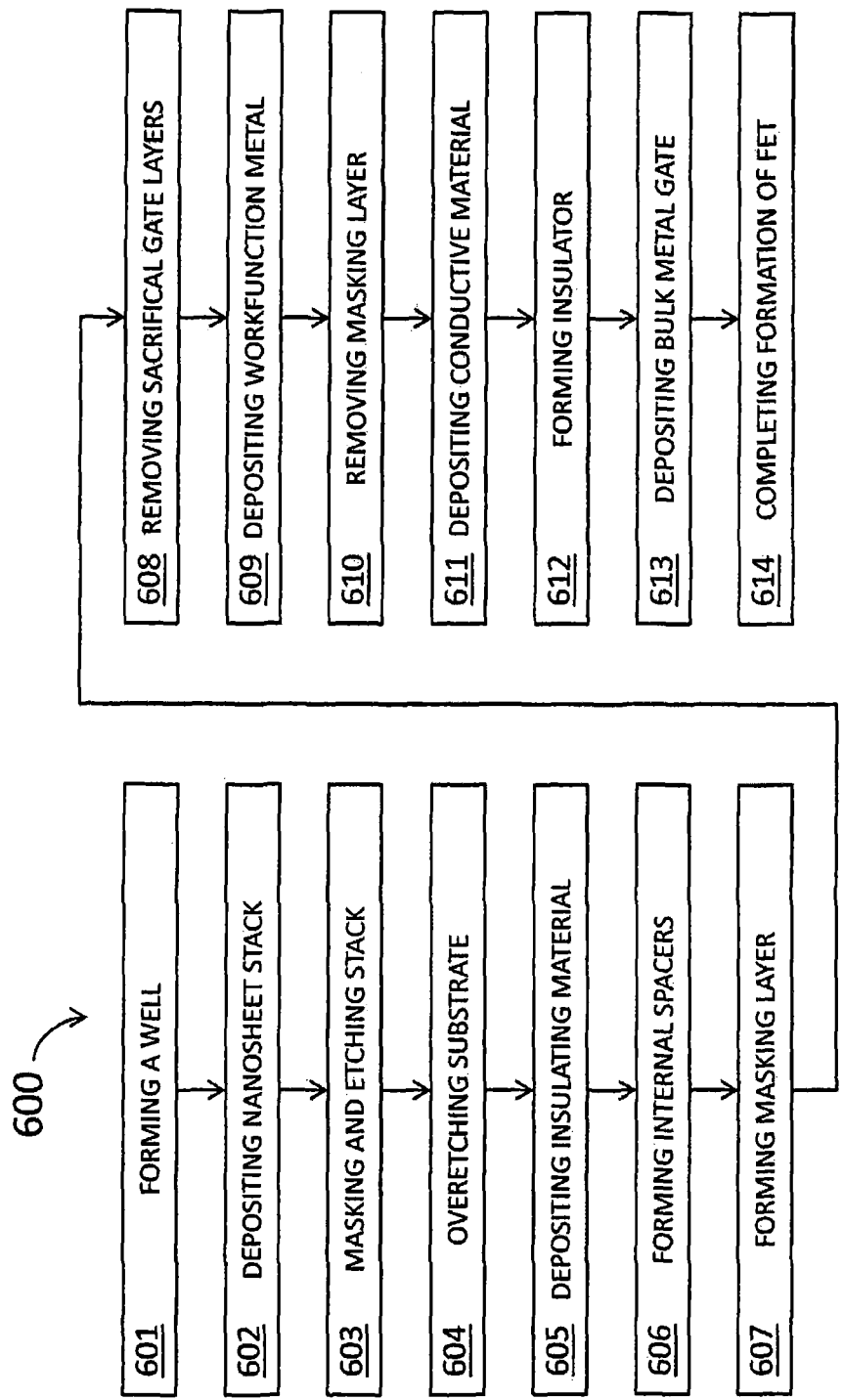
FIG. 6 is a flowchart illustrating a method of manufacturing the nanosheet FET of FIG. 4.

FIG. 6 is a flowchart illustrating a method of manufacturing the nanosheet FET of FIG. 4. Referring to FIGS. 4-6, in a method 600 for forming a stacked nanosheet FET 400, a well 410 may be formed (block 601) that may be doped with impurities at a surface of a substrate. A nanosheet stack may be deposited on the well 410 (block 602). The nanosheet stack may include an isolation layer 430 that may be adjacent the surface of the substrate and layers of a sacrificial gate material 425 and that may be interspersed by respective nanosheet layers of a channel material 420. The channel material 420 may include a semiconductor material that may be doped with impurities of the same conductivity type as the impurities of the well 410.

The nanosheet stack may be masked and etched to define first and second separated nanosheet stacks (block 603). Portions of the surface of the substrate not covered by the first and second separated nanosheet stacks may be overetched (block 604) and an insulating material 440 may be deposited in the overetched portions of the surface of the substrate (block 605). Portions of edges of the layers of the sacrificial gate material 425 may be removed and internal spacers 450 may be formed in the removed portions of the edges of the layers of the sacrificial gate material 425 (block 606). A masking layer 455 may be formed between the first and second nanosheet stacks (block 607). The layers of the sacrificial gate material 425 may be removed (block 608). A workfunction metal 460 may be deposited on the first and second nanosheet stacks and in spaces formed by the removing the layers of the sacrificial gate material 425 (block 609). The masking layer 455 and the insulating material 440 in the overetched portions of the surface of the substrate under the masking layer 455 may be removed (block 610).

A conductive material 470 may be formed in a space formed by the removing the masking layer 455 and the insulating material 440 (block 611). The conductive material 470 may electrically connect ones of the nanosheet layers of channel material 420 to the well 410. The conductive material 470 may include a semiconductor material that may be doped with impurities of the same conductivity type as the impurities of the well 410. An insulator 480 may be formed on a top surface of the conductive material 470 (block 612). A bulk metal gate material 490 may be deposited on the first and second nanosheet stacks (block 613). The bulk metal gate material 490 may electrically connect to the workfunction metal 460. The formation of the stacked nanosheet FET 400 may be completed (block 614).

Figure 7:
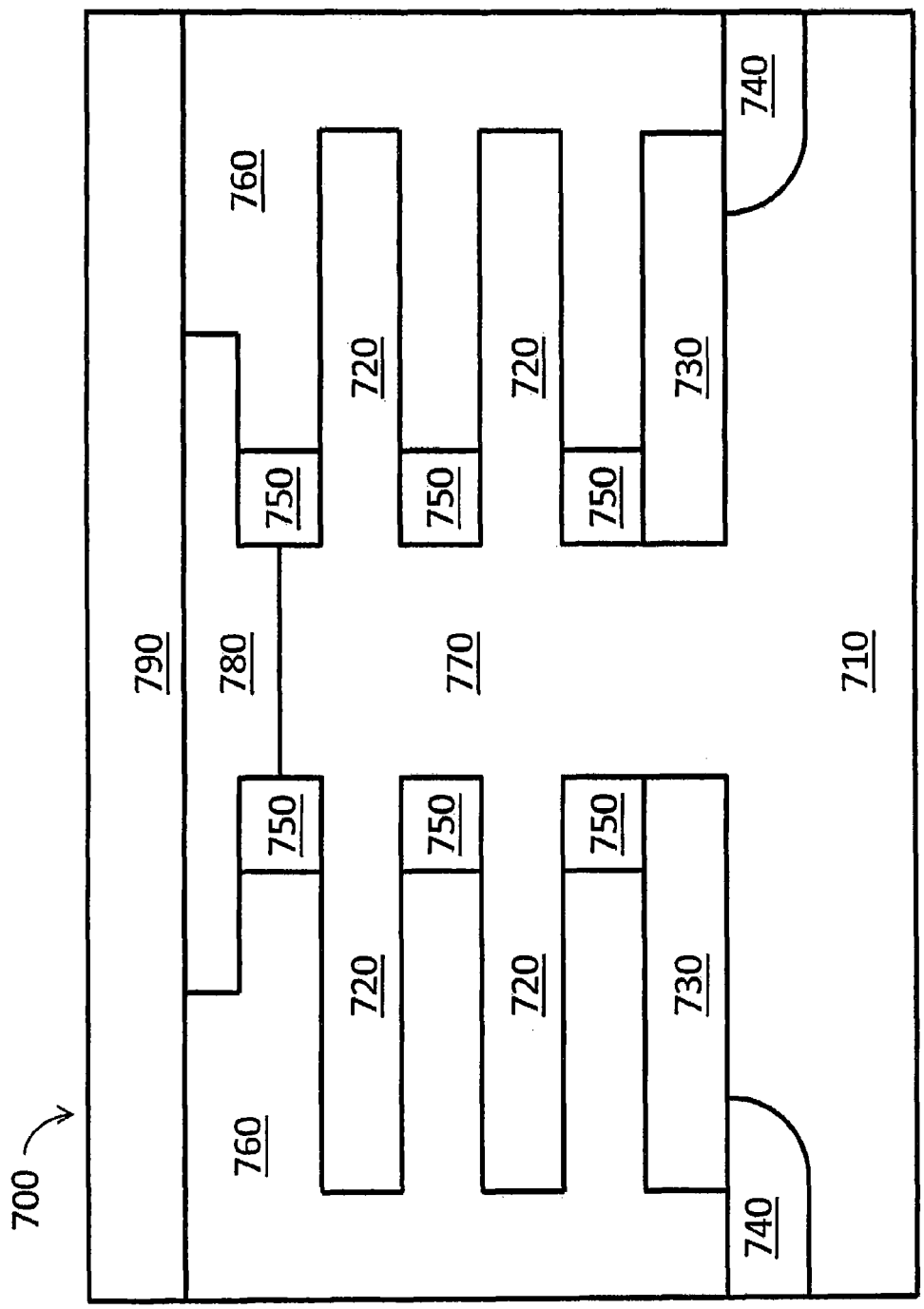
FIG. 7 is a cross sectional view schematically illustrating a nanosheet FET according to some embodiments of the inventive concept.

FIG. 7 is a cross sectional view schematically illustrating a nanosheet FET according to some embodiments of the inventive concept. Referring to FIGS. 4 and 7, a stacked nanosheet FET 700 may be similar to the stacked nanosheet FET 400. For example, the well 710, the stacked nanosheets 720, the isolation layer 730, the regions of insulating material 740, the internal spacers 750, the workfunction metal 760, the conductive material 770, the insulator 780, and the bulk metal 790 of the stacked nanosheet FET 700 may be similar to the well 410, the stacked nanosheets 420, the isolation layer 430, the regions of insulating material 440, the internal spacers 450, the workfunction metal 460, the conductive material 470, the insulator 480, and the bulk metal 490 of the stacked nanosheet FET 400. Descriptions of portions of the nanosheet FET 700 that are similar to the stacked nanosheet FET 400 may be omitted for brevity.

Figure 8B:
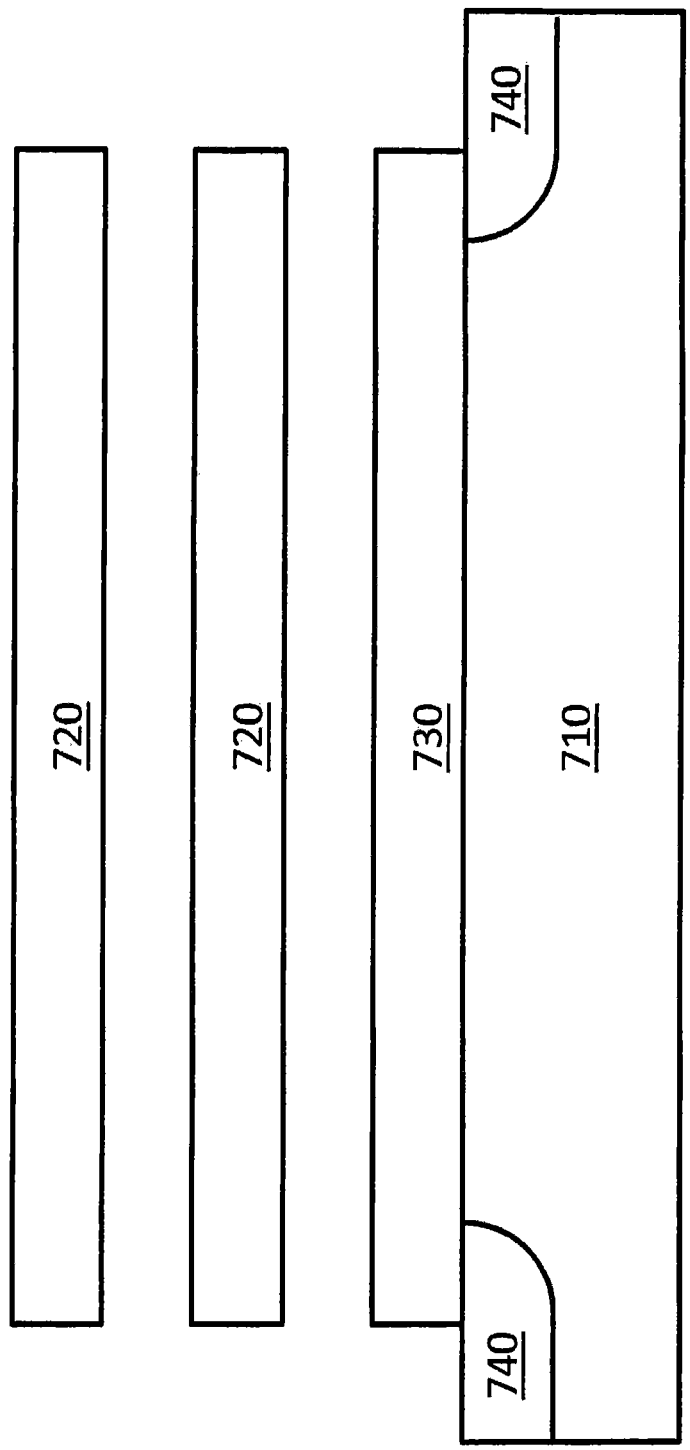

FIGS. 8A-8H are a cross sectional views schematically illustrating stages of methods of manufacturing the nanosheet FET of FIG. 7. Referring to FIG. 8A, a semiconductor stack may be grown on a well 710 that is at a surface of a substrate. The semiconductor stack may include an isolation layer 730 on the well 710 and alternating stacked layers of sacrificial gate material 725 and nanosheet layers of channel material 720 on the isolation layer 730. The layers of sacrificial gate material 725 may be similar to the layers of sacrificial gate material 425 described with reference to FIG. 4A.

Referring to FIG. 8B, a surface of the well 710 surrounding the semiconductor stack may be etched. The etched portions of the well 710 may be filled in with an insulating material to create regions of insulating material 740. The layers of sacrificial gate material 725 may be removed. The remaining structure may be held in place by a wrap-around spacer.

Figure 8C:
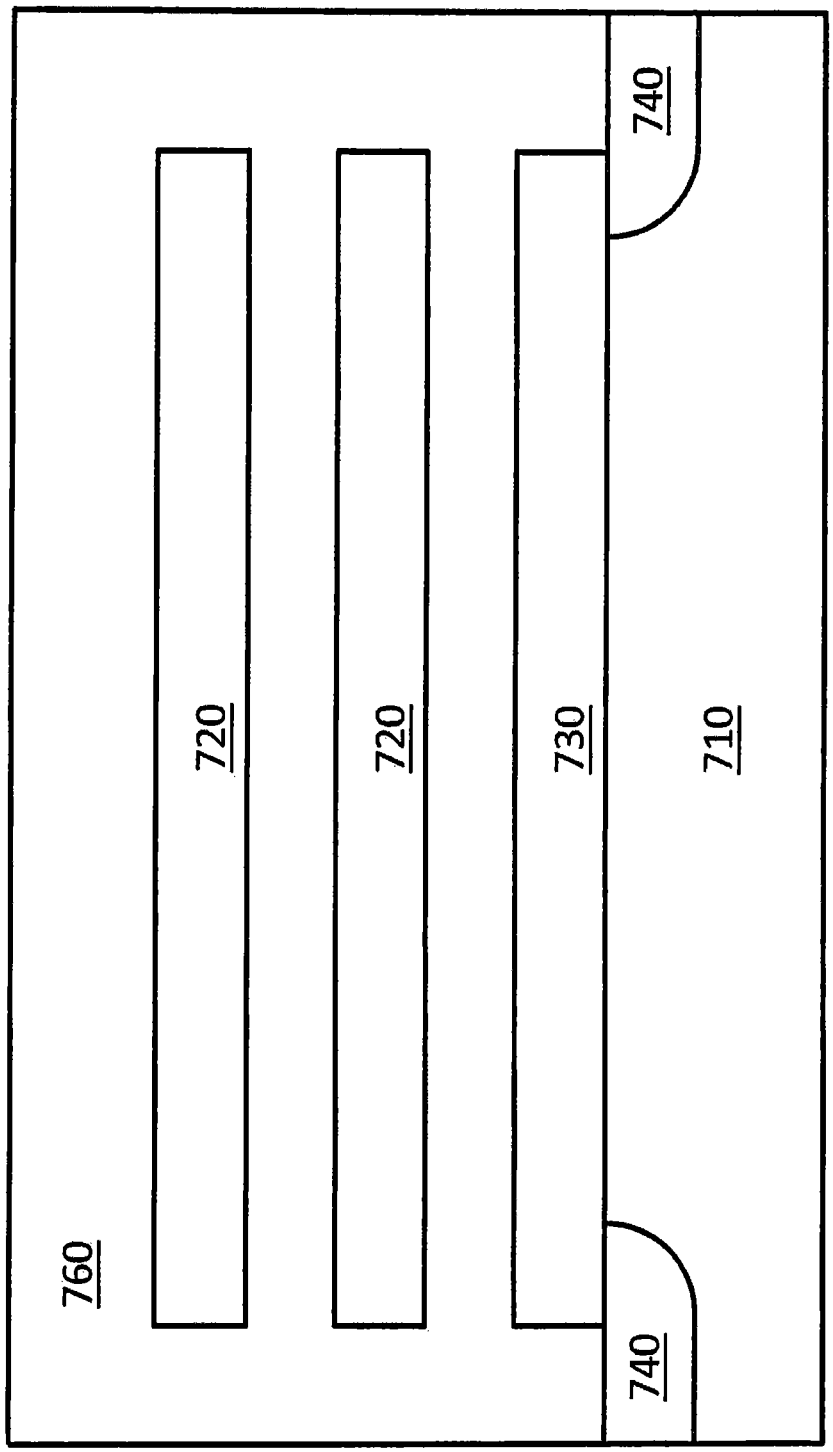

Referring to FIG. 8C, a workfunction metal 760 may be deposited on the nanosheet layers of channel material 720, around the nanosheet layers of channel material 720, and between the nanosheet layers of channel material 720. The well 410 may be electrically insulated from the workfunction metal 760 by the isolation layers 430 and the regions of insulating material 440.

Figure 8D:
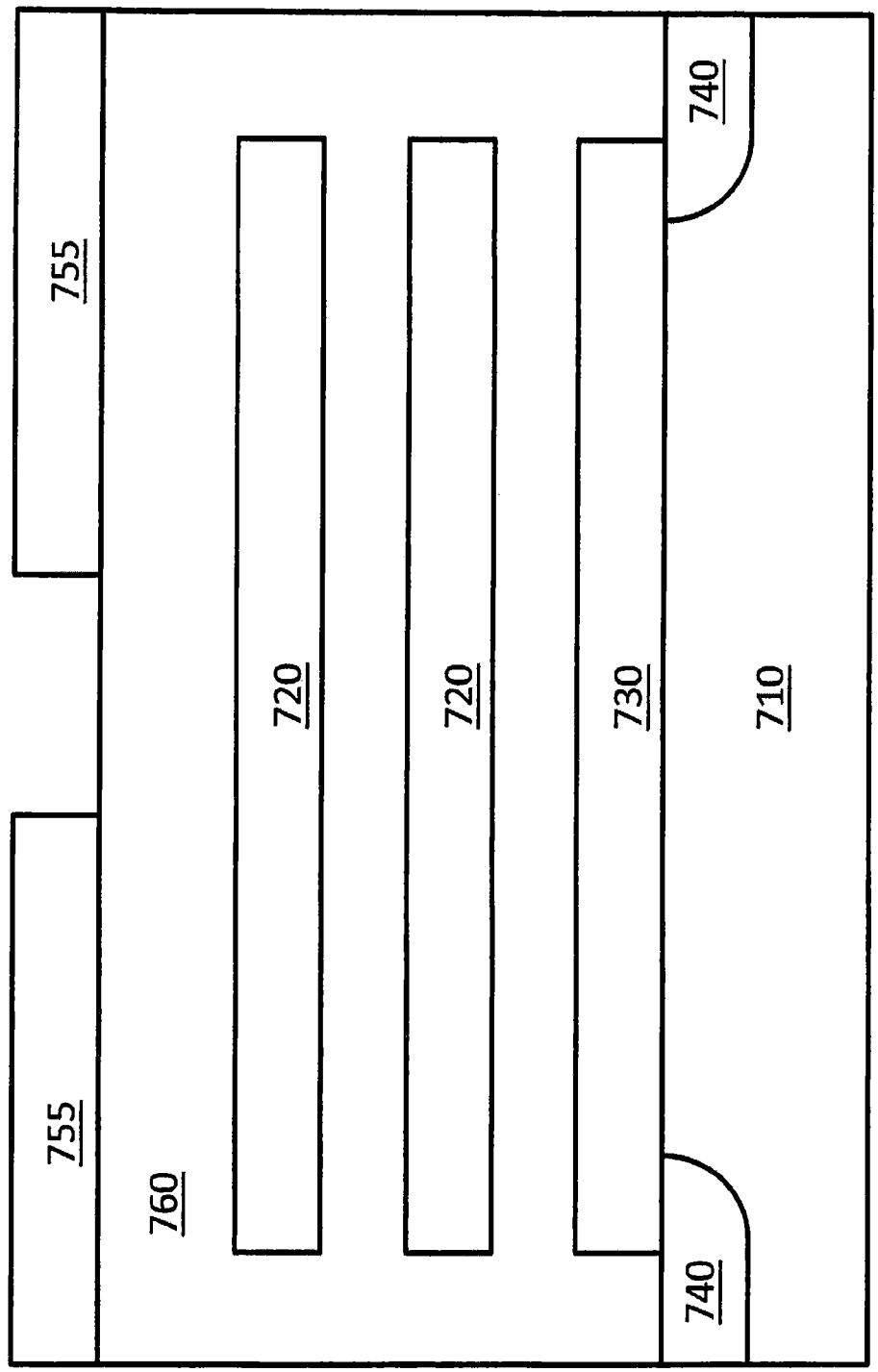
Figure 8E:
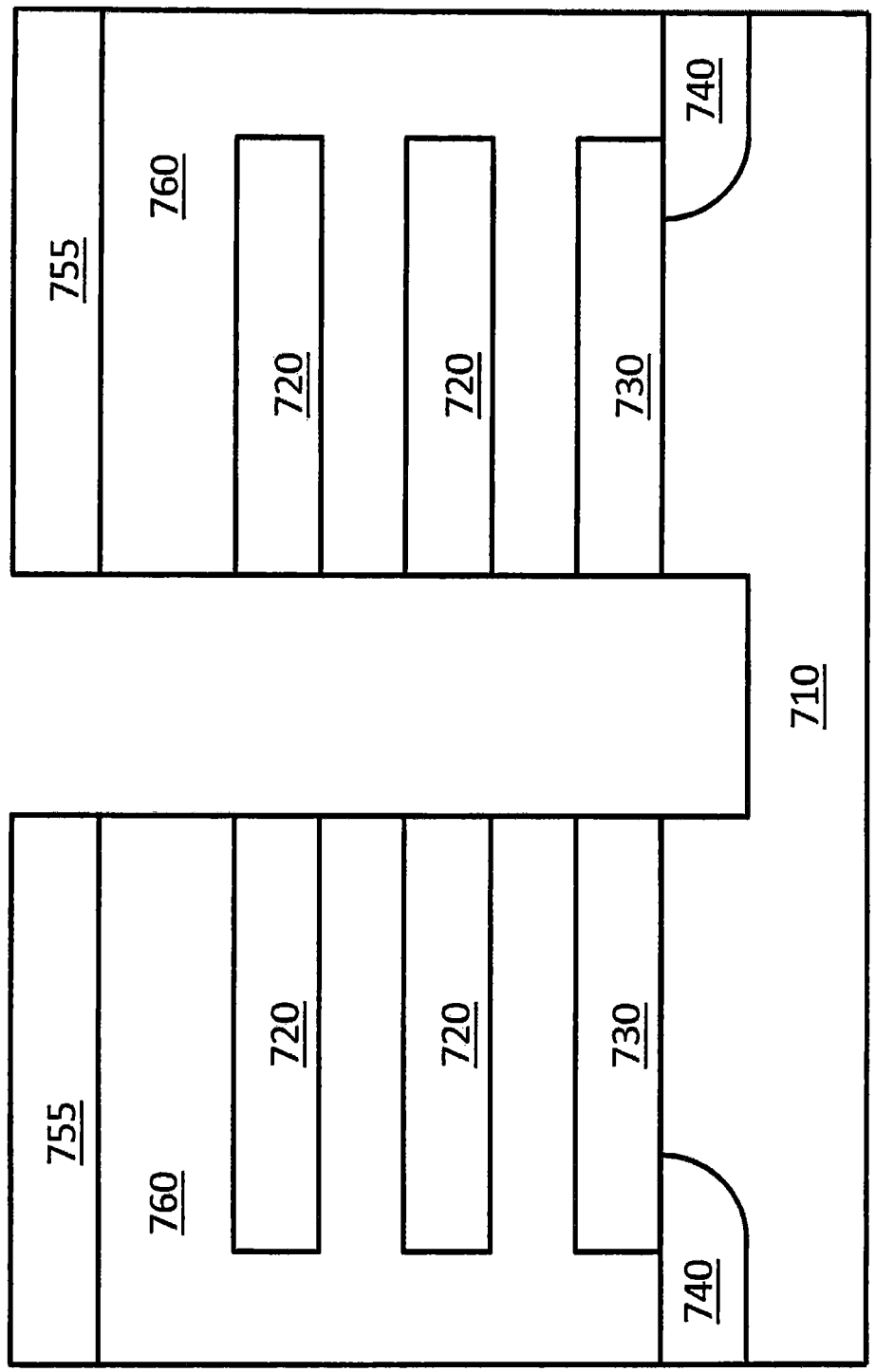

Referring to FIG. 8D, a resist material 755 may be deposited on the workfunction metal 760 to pattern a contact hole. Referring to FIG. 8E, the workfunction metal 760, the nanosheet layers of channel material 720, the isolation layer 730, and the well 710 may be vertically etched to form a contact hole defined by the pattern of the resist material 755. An anisotropic etch may be used to perform the vertical etching. The contact hole may extend through a surface of the well 710 and into the well 710.

Figure 8F:
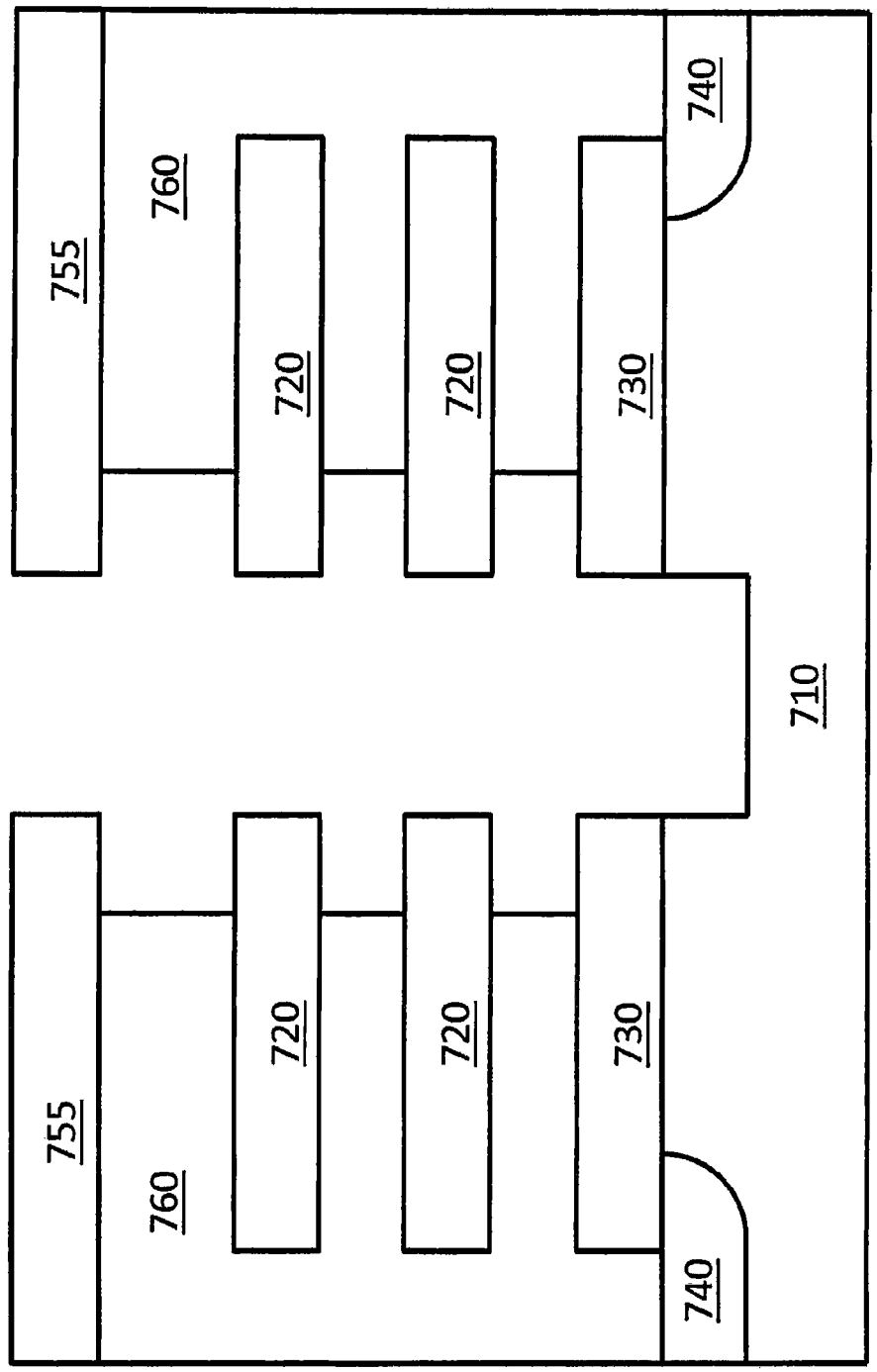

Referring to FIG. 8F, the workfunction metal 760 may be partially etched. In some embodiments, an entire surface of the wafer may be covered except for the contact hole such that only metal from within the contact hole is removed. The partial etching may be performed using an isotropic etch that is selective to the nanosheet layers of channel material 720.

Figure 8G:
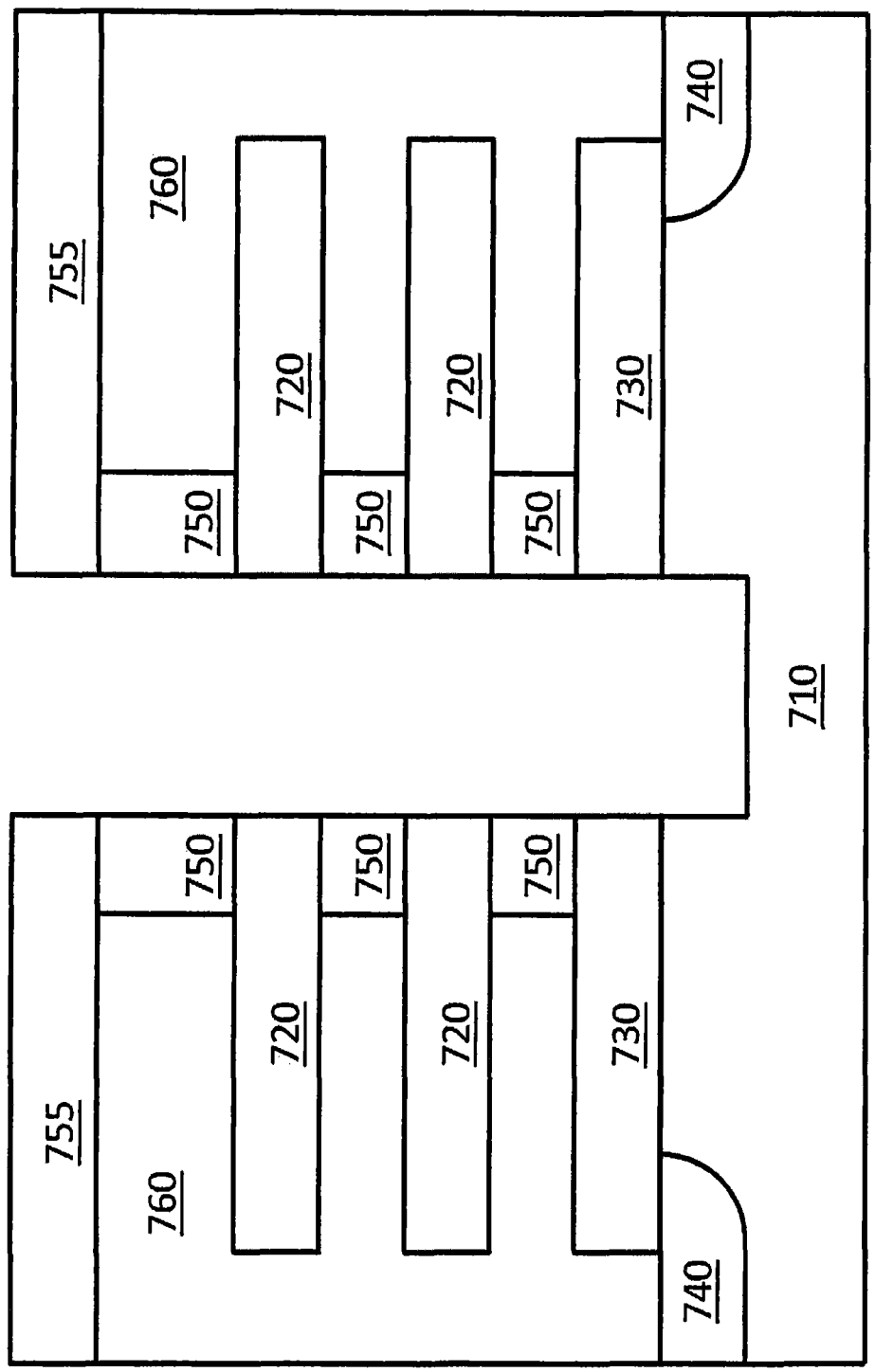

Referring to FIG. 8G, the contact hole may be filled with a low-k dielectric material. In some embodiments, the contact hole may be filled with oxide. The low-k dielectric material may be vertically etched through the contact hole pattern of the resist material 755 to form the internal spacers 750. The vertical etch of the low-k dielectric may expose edge portions of the layers of channel material 720. Similar to the conductive material 470, the conductive material 770 may provide a conductive path from the stacked nanosheets 720 to the substrate for minority carriers. In some embodiments, the conductive material 770 and the well 710 may each be doped at a greater impurity concentration than an impurity concentration of the nanosheets 720. For example, in some embodiments, the conductive material 770 and the well 710 may each be moderately doped and the nanosheets 720 may be intrinsic or lightly doped. Thus, majority carriers in the nanosheets 720 may face an electrostatic barrier while minority carriers may be pulled into the substrate. This may decrease and/or virtually elimination PBE gain while retaining near-GAA electrostatic control of the nanosheets 720. The stacked nanosheet FET 700 may therefore be used for RVT applications and may have leakage currents on the order of about 0.1 to 1 nA/μm.

Figure 8H:
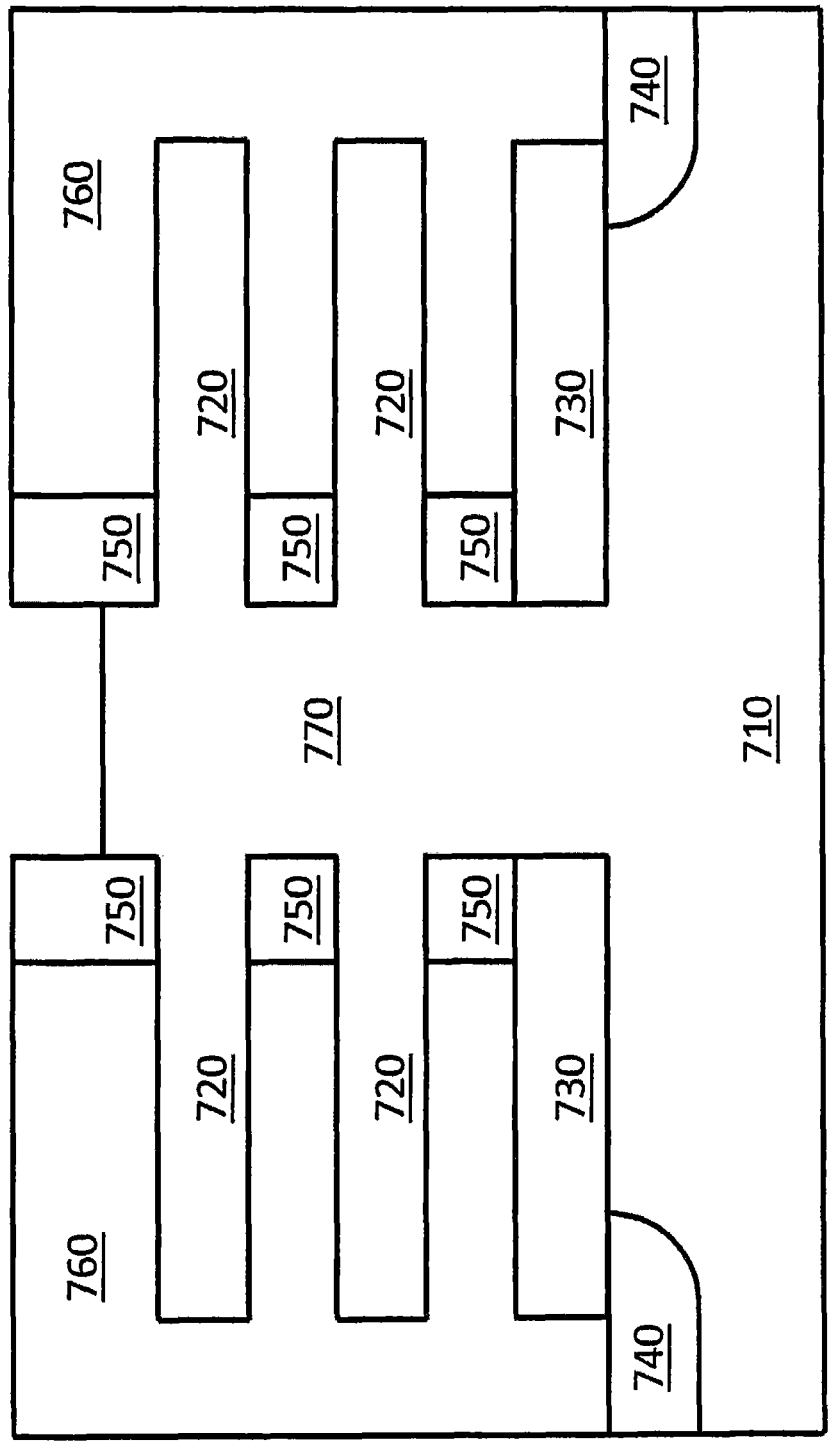

Referring to FIG. 8H, the contact hole may be filled with a conductive material 770 that may electrically connect ones of the nanosheets 720 to the well 710. Referring again to FIG. 7, the resist material 755 may be removed, an insulator 780 may be deposited on the conductive material 770, and a bulk metal gate material 790 may be formed on the insulator 780 and on the workfunction metal 760. Thus, the stacked nanosheet FET 400 may be formed.

Figure 9:
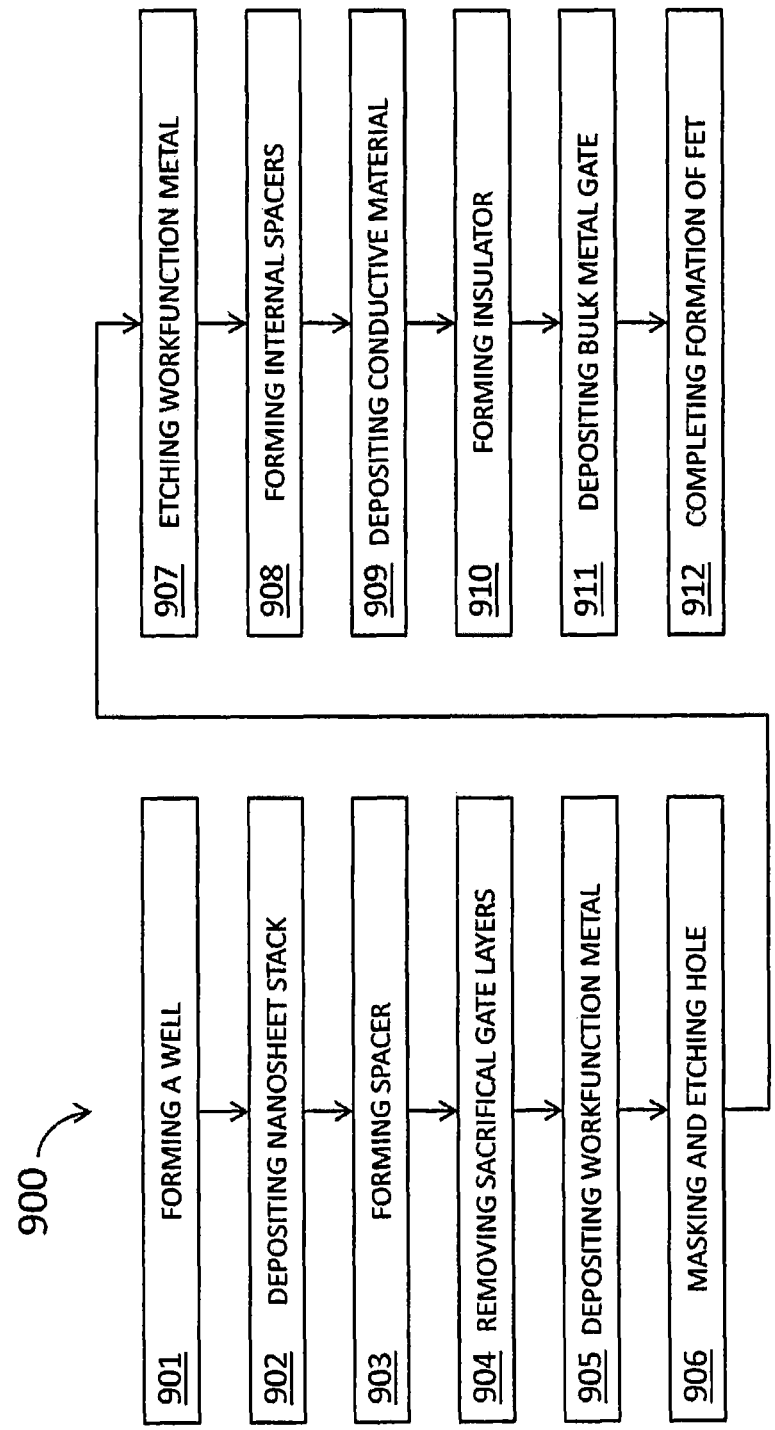
FIG. 9 is a flowchart illustrating a method of manufacturing a nanosheet FET according to some embodiments of the inventive concept.

FIG. 9 is a flowchart illustrating a method of manufacturing a nanosheet FET according to some embodiments of the inventive concept. Referring to FIGS. 7-9, in a method 900 of forming the stacked nanosheet FET 700, a well 710 may be provided that may be doped with impurities at a surface of a substrate (block 901). The method may include depositing a nanosheet stack on the well (block 902). The nanosheet stack may include an isolation layer 730 that may be adjacent the surface of the substrate and layers of a sacrificial gate material 725 that may be interspersed by respective nanosheet layers of a channel material 720. The channel material may include a semiconductor material that may be doped with impurities of the same conductivity type as the impurities of the well 410.

A wrap-around spacer may be formed on the nanosheet stack (block 903). The layers of the sacrificial gate material 725 may be removed (block 904). A workfunction metal 760 may be deposited on the stack and in spaces formed by the removing the layers of the sacrificial gate material 725 (block 905). A contact hole may be masked and etched that extends through the nanosheet stack and into a portion of the surface of the substrate (block 906). Portions of the workfunction metal 760 exposed by the contact hole may be etched (block 907). Internal spacers 750 may be formed in the etched portions of the workfunction metal 760 (block 908).

A conductive material 770 may be deposited in the contact hole (block 909). The conductive material 770 may electrically connect ones of the nanosheet layers of channel material 720 to the well 710. The conductive material 770 may include a semiconductor material that may be doped with impurities of the same conductivity type as the impurities of the well 410. An insulator 780 may be formed on a top surface of the conductive material 770 (block 910). A bulk metal gate material 790 may be deposited on the nanosheet stack (block 911). The bulk metal gate material 790 may be electrically connected to the workfunction metal 760. The formation of the stacked nanosheet FET 700 may be completed (block 912).

While the inventive concept has been described with reference to some embodiments, it will be apparent to those skilled in the art that various changes and modifications may be made without departing from the spirit and scope of the inventive concept. It should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A device comprising a nanosheet field effect transistor (FET), the nanosheet FET comprising:
    a well that is doped with impurities at a surface of a substrate;
    a channel comprising a plurality of stacked nanosheets on the well, ones of the plurality of stacked nanosheets comprising a semiconductor material that is doped with impurities of a same conductivity type as the impurities of the well and ones of the plurality of stacked nanosheets spaced apart from each other in a direction that is perpendicular to the surface of the substrate;
    a gate comprising a workfunction metal on the plurality of nanosheets, between adjacent ones of the plurality of nanosheets, and between the plurality of nanosheets and the well;
    a conductive material adjacent the plurality of nanosheets and that electrically connects ones of the plurality of nanosheets to the well;
    an isolation layer on the well that electrically insulates the well from the workfunction metal.

2. The device of claim 1, wherein the conductive material comprises a semiconductor material that is doped with impurities of the same conductivity type as the impurities of the well.

3. The device of claim 2, wherein the conductive material comprises the same semiconductor material as the plurality of nanosheets.

4. The device of claim 2,
    wherein an impurity concentration of the conductive material is greater than an impurity concentration of ones of the plurality of nanosheets, and
    wherein an impurity concentration of the well is greater than the impurity concentration of the ones of the plurality of nanosheets.

5. The device of claim 2,
    wherein the impurities of the well, the impurities of the nanosheets, and the impurities of the conductive material are p-type impurities,
    wherein ones of the plurality of nanosheets comprise a group IV semiconductor material comprising germanium at a first mole fraction, and
    wherein the conductive material comprises a group IV semiconductor material comprising germanium at a second mole fraction that is greater than the first mole fraction.

6. The device of claim 2,
    wherein the impurities of the well, the impurities of the nanosheets, and the impurities of the conductive material are n-type impurities, wherein ones of the plurality of nanosheets comprise a group III-V semiconductor material comprising indium at a first mole fraction, and wherein the conductive material comprises a group III-V semiconductor material comprising indium at a second mole fraction that is less than the first mole fraction.

7. The device of claim 1, wherein the isolation layer comprises a wide bandgap semiconductor material.

8. The device of claim 1, wherein the nanosheet FET comprises a leakage current of less than about 1 nA/μm.

9. The device of claim 1, wherein ones of the plurality of nanosheets comprise a thickness in the direction that is perpendicular to the surface of the substrate and a width in a direction that is parallel to the surface of the substrate, wherein the width is at least twice the thickness.

10. The device of claim 1, wherein the nanosheet FET further comprises a plurality of internal spacers on respective ones of the plurality of nanosheets and that electrically insulates the conductive material from the workfunction metal.

11. A device comprising a nanosheet field effect transistor (FET), the nanosheet FET comprising:
   a substrate comprising a well that is doped with impurities at a surface of the substrate;
   a first channel stack comprising a first plurality of nanosheets on the well, ones of the first plurality of stacked nanosheets comprising a semiconductor material that is doped with impurities of a same conductivity type as the impurities of the well and ones of the first plurality of stacked nanosheets spaced apart from each other in a first direction that is perpendicular to the surface of the substrate;
   a second channel stack comprising a second plurality of nanosheets on the well, ones of the second plurality of stacked nanosheets comprising a semiconductor material that is doped with impurities of the same conductivity type as the impurities of the well and ones of the second plurality of stacked nanosheets spaced apart from each other in the first direction that is perpendicular to the surface of the substrate and spaced apart from respective ones of the first plurality of nanosheets in a second direction that is parallel to the surface of the substrate;
   a gate comprising a workfunction metal on the first plurality of nanosheets, between adjacent ones of the first plurality of nanosheets, between the first plurality of nanosheets and the well, on the second plurality of nanosheets, between adjacent ones of the second plurality of nanosheets, and between the second plurality of nanosheets and the well;
   a plurality of internal spacers on respective ones of the first and second pluralities of nanosheets and that electrically insulates the conductive material from the workfunction metal;
   a conductive material between the first and second pluralities of nanosheets and electrically connects ones of the first and second pluralities of nanosheets to the well; and
   an isolation layer on the well that electrically insulates the well from the workfunction metal.

12. The device of claim 11, wherein the conductive material comprises a semiconductor material that is doped with impurities of the same conductivity type as the impurities of the well.

13. The device of claim 12, wherein the conductive material comprises the same semiconductor material as the plurality of nanosheets.

14. The device of claim 12,
   wherein an impurity concentration of the conductive material is greater than an impurity concentration of ones of the plurality of nanosheets, and
   wherein an impurity concentration of the well is greater than the impurity concentration of the ones of the plurality of nanosheets.

15. The device of claim 12,
   wherein the impurities of the well, the impurities of the nanosheets, and the impurities of the conductive material are p-type impurities,
   wherein ones of the plurality of nanosheets comprise a group IV semiconductor material comprising germanium at a first mole fraction, and
   wherein the conductive material comprises a group IV semiconductor material comprising germanium at a second mole fraction that is greater than the first mole fraction.

16. The device of claim 12,
   wherein the impurities of the well, the impurities of the nanosheets, and the impurities of the conductive material are n-type impurities,
   wherein ones of the plurality of nanosheets comprise a group III-V semiconductor material comprising indium at a first mole fraction, and
   wherein the conductive material comprises a group III-V semiconductor material comprising indium at a second mole fraction that is less than the first mole fraction.

17. The device of claim 11, wherein the isolation layer comprises a wide bandgap semiconductor material.

18. The device of claim 11, comprising a leakage current of less than about 1 nA/μm.

19. The device of claim 11, wherein ones of the first plurality of nanosheets and ones of the second plurality of nanosheets comprise a thickness in the first direction that is perpendicular to the surface of the substrate and a width in a direction that is parallel to the surface of the substrate, wherein the width is at least twice the thickness.

20. The device of claim 11, wherein the nanosheet FET further comprises a plurality of internal spacers on respective ones of the first and second pluralities of nanosheets and that electrically insulates the conductive material from the workfunction metal.

* * * * *